(12) United States Patent
Khamkar et al.

(10) Patent No.: US 11,907,977 B2
(45) Date of Patent: *Feb. 20, 2024

(54) COLLABORATIVE TEXT DETECTION AND TEXT RECOGNITION

(71) Applicant: Zaru, Inc., Pleasanton, CA (US)

(72) Inventors: Susheel Khamkar, Pleasanton, CA (US); Lino Fabiani, San Francisco, CA (US); Edwin Villanueva, San Jose, CA (US)

(73) Assignee: Zaru, Inc., Pleasanton, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/972,499

(22) Filed: Oct. 24, 2022

(65) Prior Publication Data
US 2023/0125696 A1 Apr. 27, 2023

Related U.S. Application Data

(63) Continuation of application No. 17/512,574, filed on Oct. 27, 2021, now Pat. No. 11,481,823.

(51) Int. Cl.
*G06Q 30/04* (2012.01)
*G06Q 10/0631* (2023.01)
(Continued)

(52) U.S. Cl.
CPC ............ *G06Q 30/04* (2013.01); *G06F 16/93* (2019.01); *G06F 30/27* (2020.01); *G06F 40/117* (2020.01);
(Continued)

(58) Field of Classification Search
CPC ............ G06Q 30/04; G06Q 10/063112; G06F 16/93; G06F 30/27; G06F 40/117;
(Continued)

(56) References Cited

U.S. PATENT DOCUMENTS

| 5,960,404 A | 9/1999 | Chaar et al. |
| 11,481,823 B1 * | 10/2022 | Khamkar ....... G06Q 10/063112 |

(Continued)

FOREIGN PATENT DOCUMENTS

CN 112784829 A 5/2021

OTHER PUBLICATIONS

Aniket Kittur et al., "CrowdForge: Crowdsourcing Complex Work," Proceedings of the 24th Annual ACM Symposium on User Interface Software and Technology, 2011, pp. 1-10.
(Continued)

*Primary Examiner* — Stephen S Hong
*Assistant Examiner* — Broderick C Anderson
(74) *Attorney, Agent, or Firm* — Outlier Patent Attorneys, PLLC

(57) ABSTRACT

Described are approaches for assigning tasks between machine resources (e.g., AI task performers, AI task validators), human resources (e.g., task performers, task validators), and/or other smart systems to facilitate collaborative text detection, text recognition, and text retrieval in order to optimize system performance along a variety of different selection criteria specifying various performant dimensions, including, but not limited to improving system efficiency, reducing task performer and/or task validator idle time, improving triage outcomes, reducing data processing loads, maintaining client confidentiality, etc., that may be associated with one or more customers.

20 Claims, 12 Drawing Sheets

(51) Int. Cl.
  *G06F 16/93* (2019.01)
  *G06F 30/27* (2020.01)
  *G06F 40/117* (2020.01)
  *G06F 40/186* (2020.01)
  *G06V 10/22* (2022.01)
  *G06V 30/413* (2022.01)
  *G06V 30/10* (2022.01)

(52) U.S. Cl.
  CPC ... *G06F 40/186* (2020.01); *G06Q 10/063112* (2013.01); *G06V 10/225* (2022.01); *G06V 30/413* (2022.01); *G06V 30/10* (2022.01)

(58) Field of Classification Search
  CPC .. G06F 40/186; G06V 10/225; G06V 30/413; G06V 30/10
  USPC ........................................................ 705/7.14
  See application file for complete search history.

(56) References Cited

U.S. PATENT DOCUMENTS

| | | |
|---|---|---|
| 2009/0241183 A1 | 9/2009 | Boss et al. |
| 2013/0022231 A1 | 1/2013 | Nepomniachtchi et al. |
| 2016/0259772 A1 | 9/2016 | Kato |
| 2018/0144042 A1 | 5/2018 | Sheng et al. |
| 2021/0149931 A1 | 5/2021 | Iliadis |

OTHER PUBLICATIONS

Anikut Kittur et al., "CrowdWeaver: Visually Managing Complex Crowd Work," Proceedings of the ACM 2012 Conference on Computer Supported Cooperative Work, 2012, pp. 1-4.

* cited by examiner

COLLABORATIVE TEXT DETECTION AND TEXT RECOGNITION

CROSS-REFERENCE TO RELATED APPLICATION(S)

This application is a continuation of U.S. Non-Provisional application Ser. No. 17/512,574, entitled "COLLABORATIVE TEXT DETECTION AND TEXT RECOGNITION," filed on Oct. 27, 2021, which is expressly incorporated by reference herein in its entirety.

BACKGROUND

Optical character recognition (OCR) is a technique in recognizing either hand-written characters or scanned characters. However, most of the existing OCR systems, such as those provided by Google, Microsoft, and the like, simply allow for uploading an image file for OCR and downloading the recognition result. In the situation where thousands of vendors with unique document layouts require accurate text recognition and segmentation, such as in the restaurant and hospitality industry, conventional text recognition approaches may fail to accurately recognize text in document fields (e.g., quantity field or a description field), tables, columns, images, and within other document layouts.

Moreover, for these documents, conventional OCR systems oftentimes fail to accurately segment any recognized text such that the recognized text is useful and valuable to a vendor for further processing, including, for example, inventory costing, recipe costing, inventory analysis, pricing analysis, and so on.

Some OCR systems may provide machine-learning based approaches, which allow the system to learn the document layout of a document to improve text recognition and segmentation. However, using machine-learning based approaches to train models for thousands of documents with unique document layouts may be cost prohibitive for many vendors, and in some situations, not possible due to available training data, time, and/or resources.

Further to this, captured images of documents are often associated with poor quality because of the environment in which they are captured, motion and focus blur, light variations or noise, rotated documents, incorrect document types, wrong file formats, personally identifiable information, etc., which further exasperates conventional and machine-learning based approaches to text recognition and segmentation.

Additionally, manual approaches for processing documents can be expensive or at least time consuming. For example, assume a company that is processing financial documents at large scale. For example receipts and invoices for loyalty purposes. Using conventional approaches, a data entry team has to check receipts in an interface and extract certain data or perform certain approvals. Conventionally approaches for processing documents at large scale, including manually rotating documents, can be a time consuming and frustrating task, costing time and resources. As technology advances, it can be advantageous to adapt the ways in which images are processed by an OCR engine in order to improve text recognition and segmentation precision.

SUMMARY

Systems and methods in accordance with various embodiments of the present disclosure may overcome one or more of the aforementioned and other deficiencies experienced in conventional approaches to document processing. In particular, various embodiments enable a computing device and a network of resources (e.g., human task performers, human task validators, AI task performers, AI task validators, etc.) to more accurately and efficiently detect and recognize text in documents. In many instances, text represented in an image or another data format can be detected by applying a suitable collaborative text detection, text recognition, and text retrieval method between human and machine task performers and task validators, and/or other smart systems based on document information, where the collaborative text detection, text recognition, and text retrieval method can include one or more tasks (also referred to as subtasks in certain embodiments) that are processed using machine and human resources. In this way, approaches facilitate collaborative text detection, text recognition, and text retrieval between machine resources (e.g., AI task performers, AI task validators) and human resources (e.g., task performers, task validators) to generate user desired data.

Instructions for causing a computer system to facilitate collaborative text detection, text recognition, and text retrieval between machine resources (e.g., AI task performers, AI task validators) and human resources (e.g., task performers, task validators) in accordance with the present disclosure may be embodied on a computer-readable medium. For example, in accordance with an embodiment, a backend system may maintain models and/or features for the models (including feature vectors) for a plurality of vendor templates, task performers, and task validators. The models and features can be determined using historic activity data and document data associated with documents, task performers, and task validators. The backend system can utilize the models and features to assign tasks to task performers and task, and/or other smart systems to optimize system performance optimize system performance along a variety of different performant dimensions specified by selection criteria, including, for example, improving system efficiency, reducing task performer idle time, reducing validation performer idle time, improving triage outcomes, reducing data processing loads, maintaining client confidentiality, in accordance with a cost structure, etc. The backend system can update the models and/or feature vectors upon the completion of a task, upon completion of a number of tasks, in response to an event such as going offline or online of a task performer and/or task validator, with respect to an interval of time, or a combination thereof.

It should be noted that although the techniques described herein may be used for a wide variety of documents, for clarity of presentation, examples of invoices such as restaurant or hospitality invoices will be used. The techniques described herein, however, are not limited to restaurant or hospitality invoices, and the documents may include other types of documents such as personal documents, government documents, research documents, financial statements, etc.

Embodiments provide a variety of advantages. For example, in accordance with various embodiments, human and/or AI task performers and/or task validators or other appropriate resources may execute tasks from anywhere leading to an improvement in document processing. Moreover, the present invention reduces time and costs associated with document processing when compared to conventional document processing systems. Further, such approaches may be utilized by various industries, including, for example, hospitality, financial, legal, educational, government, among other such industries that maintain and utilize physical and digital documents. Various other functions and advantages are described and suggested below as may be provided in accordance with the various embodiments.

BRIEF DESCRIPTION OF THE DRAWING FIGURES

The accompanying drawings illustrate several embodiments and, together with the description, serve to explain the principles of the invention according to the embodiments. It will be appreciated by one skilled in the art that the particular arrangements illustrated in the drawings are merely exemplary and are not to be considered as limiting of the scope of the invention or the claims herein in any way.

DETAILED DESCRIPTION

Figure 1:
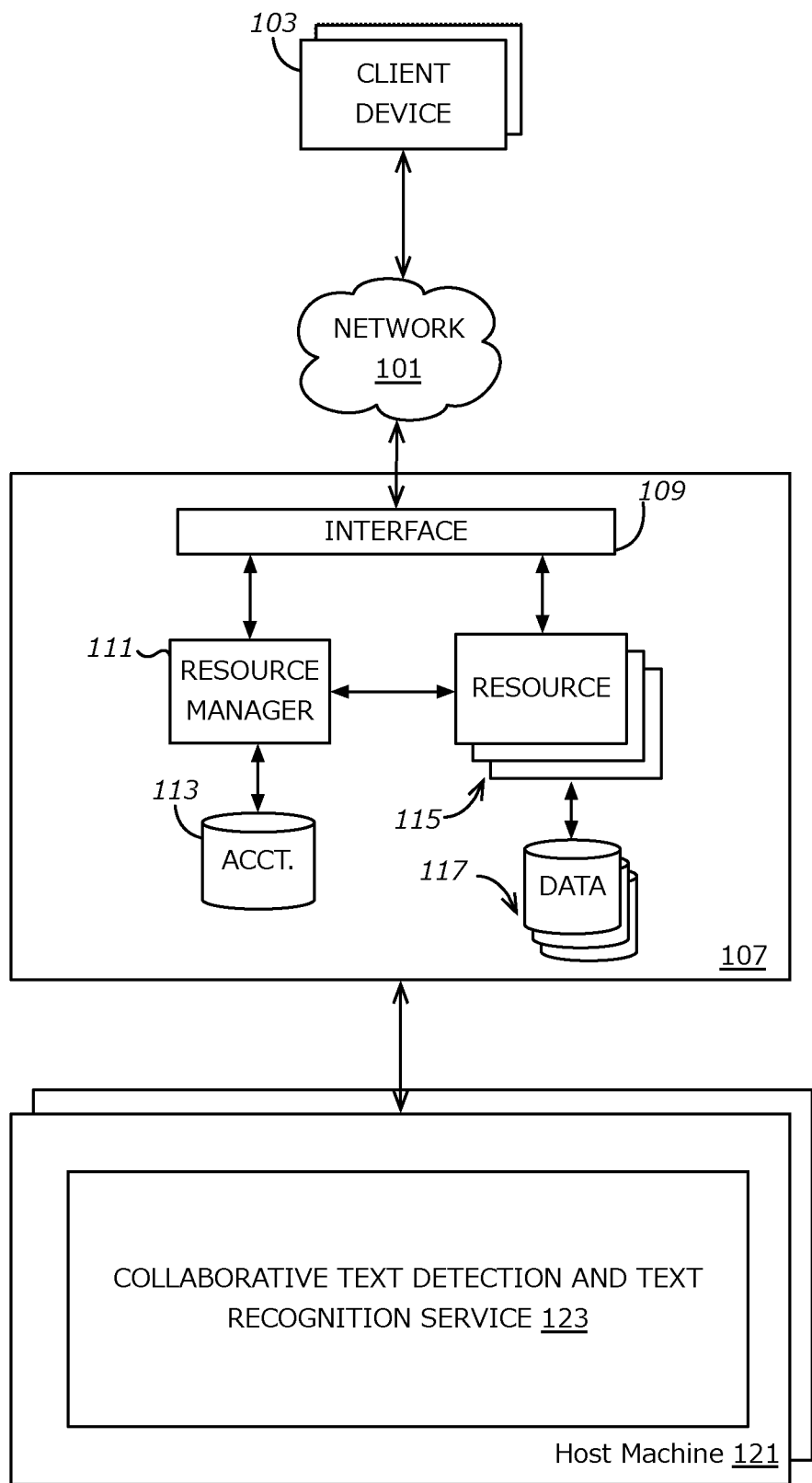
FIG. 1 illustrates an example environment in which aspects of the various embodiments can be implemented.

FIG. 1 illustrates an example environment in which aspects of the various embodiments can be implemented. In this example, a user can utilize a device 103 to communicate across at least one network 101 with a resource provider environment 107. The device 103 can include any appropriate electronic device operable to send and receive requests or other such information over an appropriate network and convey information back to a user of the device. Examples of such customer devices 103 include personal computers, tablet computers, smartphones, notebook computers, and the like. The user can include a person authorized to manage the aspects of the resource provider environment.

The network(s) 101 can include any appropriate network, including an intranet, the Internet, a cellular network, a local area network (LAN), or any other such network or combination, and communication over the network can be enabled via wired and/or wireless connections.

The resource provider environment 107 can provide text recognition services as well as support services for various industries. The industries can include, for example, hospitality, financial, legal, educational, government, among other such industries that maintain and utilize physical and digital documents. The support services can include, for example, response services operable to assign tasks to response resources (e.g., human task performers, human task validators, AI task performers, AI task validators, etc.) to perform and/or review text detection tasks. In certain embodiments, resource provider of environment 107 can be an intermediary between a customer (e.g., hospitality provider) and other service provider such as an accountant. The provider can, for example, assist the accountant by providing itemized data for accounting or other appropriate recognized data.

The resource provider environment 107 can include any appropriate components for recognizing text in an image, generating tasks for task performers and/or task validators and/or other smart systems or resources, assigning those tasks to an appropriate resource, and facilitating collaborative text detection and text recognition between machine, AI, and human resources. It should be noted that although the techniques described herein may be used for a wide variety of users and requests, for clarity of presentation, examples of companies providing text detection and text retrieval services will be used.

The resource provider environment 107 might include Web servers and/or application servers for recognizing text in an image, receiving and processing tasks, and assigning those tasks to an appropriate resource (e.g., a human task performer, a human task validator, an AI task performer, an AI task validator, etc.) to assist with the task, and facilitating collaborative text detection, text recognition, and text retrieval between machine, AI, and human resources. While this example is discussed with respect to the internet, web services, and internet-based technology, it should be understood that aspects of the various embodiments can be used with any appropriate services available or offered over a network in an electronic environment.

In various embodiments, resource provider environment 107 may include various types of resources 115 that can be used to facilitate collaborative processing of tasks between human and machine task performers and task validators, and/or other smart systems. The resources can include, for example, application servers operable to process instructions provided by a user or database servers operable to process data stored in one or more data stores 117 in response to a user request. The resources may be hosted on multiple server computers and/or distributed across multiple systems. Additionally, the components may be implemented using any number of different computers and/or systems. Thus, the components may be separated into multiple services and/or over multiple different systems to perform the functionality described herein. In some embodiments, at least a portion of the resources can be "virtual" resources supported by these and/or components.

In at least some embodiments, an application executing on device 103 that needs to access resources of the provider environment 107, for example, to initiate an instance of a collaborative text detection and text recognition service, can submit a request that is received to interface layer 109 of the provider environment 107. The interface layer 109 can include application programming interfaces (APIs) or other exposed interfaces enabling a user to submit requests, such as Web service requests, to the provider environment 107. Interface layer 109 in this example can also include other components as well, such as at least one Web server, routing components, load balancers, and the like.

When a request to access a resource is received at the interface layer 109 in some embodiments, information for the request can be directed to resource manager 111 or other such systems, service, or component configured to manage user accounts and information, resource provisioning and usage, and other such aspects. Resource manager 111 can perform tasks such as communicating the request to a management component or other control component which can be used to manage one or more instances of the collaborative text detection and text recognition service as well as other information for host machines, servers, or other such computing devices or assets in a network environment, authenticate an identity of the user submitting the request, as well as to determine whether that user has an existing account with the resource provider, where the account data may be stored in at least one data store 113 in the resource provider environment 107.

For example, the request can be used to instantiate collaborative text detection and text recognition service 123 on host machine 121. As will be described further herein, the collaborative text detection and text recognition service 123 recognizes text in an image or other data, generates tasks for task performers and/or task validators and/or other smart systems, assigns those requests to an appropriate resource, facilitates collaborative processing of tasks for human and machine task performers and task validators, and/or other smart systems, generates itemized data from those images, etc. It should be noted that although host machine 121 is shown outside the provider environment, in accordance with various embodiments, one or more components of the collaborative text detection and text recognition service 123 can be included in provider environment 107, while in other embodiments, some of the components may be included in the provider environment. It should be further noted that host machine 121 can include or at least be in communication with other systems and components, for example, a training system, an AI system, a communication system, an intake system, an allocation system, task performer and task validation networks, etc. as described further in FIG. 2.

Figure 2:
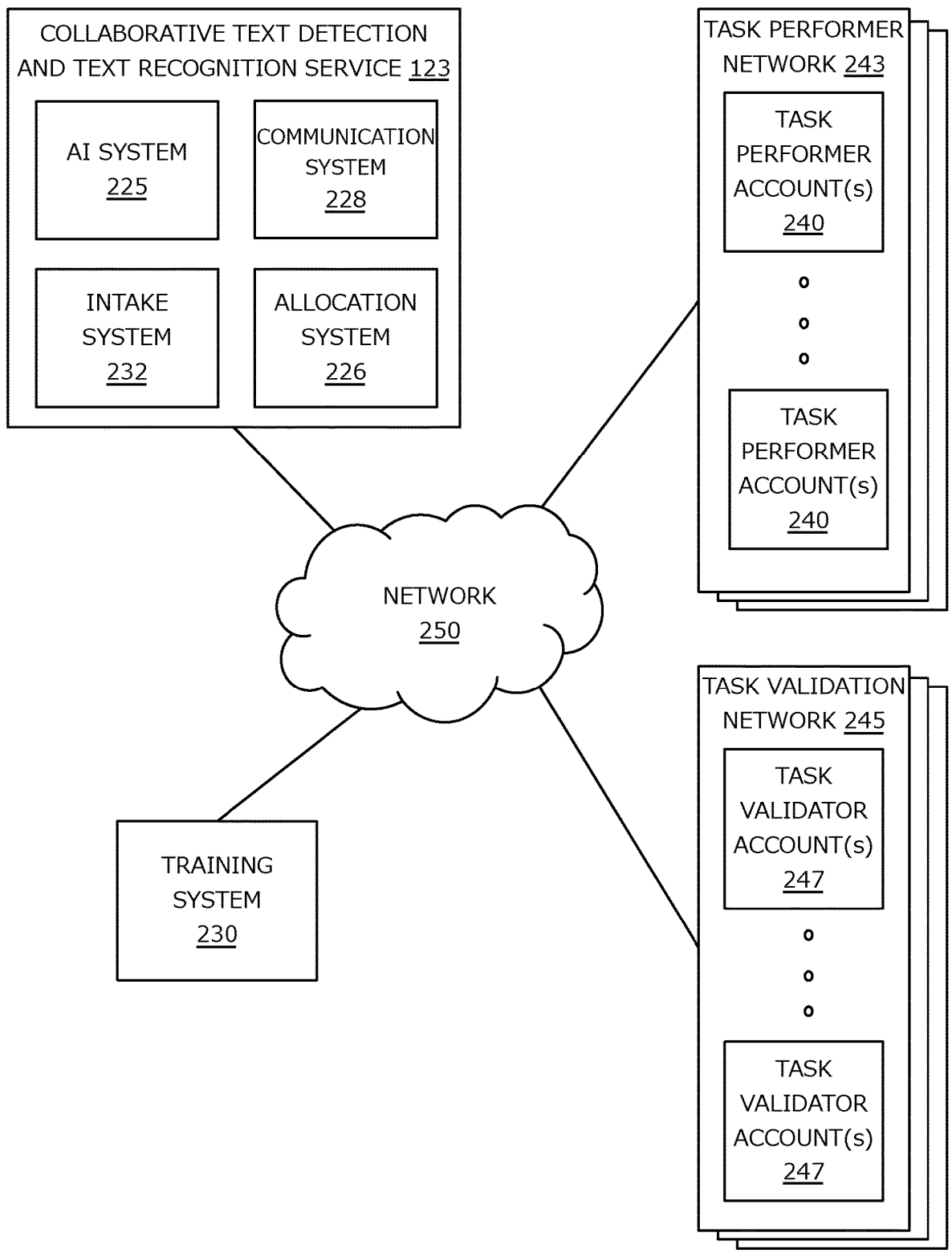
FIG. 2 illustrates an exemplary embodiment of a collaborative text detection and text recognition service according to an embodiment.

FIG. 2 illustrates an exemplary embodiment of a collaborative text detection and text recognition service according to an embodiment. It should be understood that reference numbers are carried over between figures for similar components for purposes of simplicity of explanation, but such usage should not be construed as a limitation on the various embodiments unless otherwise stated. As shown, collaborative text detection and text recognition service 123, training system 230, task performer network 243, task validation network 245 communicate and interact via network 250 to facilitate collaborative processing of tasks between human and machine task performers and task validators, and/or other smart systems. It should be known that the various components described herein are exemplary and for illustration purposes only. The components may be reorganized or consolidated, as understood by a person of ordinary skill in the art, to perform the same tasks on one or more other servers or computing devices without departing from the scope of the invention. Other components and interfaces may be used, as would be readily understood by a person of ordinary skill in the art, without departing from the scope of the embodiments described herein.

In an embodiment, collaborative text detection and text recognition service 123 may be comprised of AI system 225, communication system 228, intake system 232, and allocation system 226.

Intake system 232 is operable to obtain document data from one or more sources. The document data can include, for example, invoices (e.g., restaurant and hospitality invoices), among other such documents. As described further in FIG. 3, the document data can be preprocessed, including, for example, rotating documents, merging documents, filtering/flagging documents, etc.

The documents can be received at AI system 225. AI system 225 is operable to execute one or more machine-based tasks, including, for example, task generation, text detection, text recognition, vendor recognition, data validation, data segmentation, etc. A task in various embodiments can include a document merge task, a document filtering/flagging task, a document modification task, a document validation task, among other such tasks described herein and known in the art. AI system 225 is described in greater detail in FIG. 4.

Allocation system 226 is operable to match one or more tasks with one or more resources, including, for example, one or more task performer accounts 240 associated with task performer network 243 or one or more task validation accounts 247 associated with task validation network 245 and/or other appropriate resource. In an embodiment, task performer network 243 and/or task validation network 245 can provide a web services API for computers to integrate artificial intelligence directly into their processing by making requests of humans, such as a task performer associated with a task performer network and/or a task validator associated with a task validation network. The web services API can then be utilized to submit tasks to the appropriate network, approve completed tasks, and the results can be processed or otherwise utilized by collaborative text detection and text recognition service 123. The one or more task performer accounts 240 can be operated by one or more humans, each human having a task performer account. The one or more task validator accounts 247 can be operated by one or more humans, each human having a task validator account.

Allocation system 226 may match tasks with resources in accordance with factors, including, system efficiency, lag time, client confidentiality, resource satisfaction, resource performance, resource response rates, or a combination thereof. Factors as used herein may also be referred to as performance metrics (e.g., task performer performance metrics, validation performance metrics), selection criteria, performant dimensions, etc.

Tasks completed by a task performer can be reviewed or otherwise validated by a task validator having a validation account with a task validation network. In accordance with an embodiment, the allocation system 226 ensures that each task has sufficient human support to enable the system to remain performant and/or to prevent delays that may be otherwise associated with human response systems. It should be noted that although embodiments are described with respect to client devices and associated human task performers and task validators, other resources may be utilized including, for example, autonomous AI systems. That is, the functions of a human task performer and a human task validator can be performed in hardware and software, such as by using AI associated with a model trained for such functions. Allocation system 226 is described in greater detail in FIG. 5.

Communication system 228 is operable to assign tasks and/or groupings selected by allocation system 226 in order to optimize system performance along a variety of different performant dimensions specified by selection criteria, including, for example, improving system efficiency, reducing task performer idle time, reducing validation performer idle time, improving triage outcomes, reducing data processing loads, maintaining client confidentiality, in accordance with a cost structure, etc.

The communication system 228 can translate or otherwise present tasks in a graphical user interface that permit task performers and/or task validators to quickly and efficiently triage and respond to the tasks. Communication system 228 may classify the tasks and cause to be generated different user interfaces based on the type of tasks are classified. For example, if the task is a document merge task, then communication system 228 may generate information to present available document and document pages in such a way that the task may be completed. For example, a task performer can select pages to be merged, and the communication system or other appropriate system or component can cause the pages to be merged. A graphical user interface is described herein as being provided to a task performer and/or task validator, however, other types of communication may be provided without departing from the scope of the invention, including, but not limited to: written material such as code, instruction snippets, one or more two and/or three-dimensional images, video, audio/oral instructions, etc. In each instance the communication system 228 may translate the user input into instructions that can be presented to task performers and task validators.

Training system 230 is operable to generate models and/or features for the models for recognizing vendor associated with documents. That is, the models can identify a vendor associated with a document, and recognize and retrieve specific text represented in the document based on the vendor. In certain embodiments, a set of tasks and/or a workflow to complete a set of tasks can be generated based on the vendor.

In an embodiment, the model can be a support vector machine SVM vendor detection algorithm or other learning model. An image of a document can be received. The image can be evaluated using the model to attempt to match the image of the document to a stored image of vendor templates. In the situation there is a high confidence match, such as a match satisfying a threshold level of confidence, text entries for document fields or other data fields represented in the document can be retrieved and used in other processes. For example, the text entries can be presented to a task performer to perform one or more tasks. In an example, the text entries can be presented to a task performer to verify that the retrieved text entries match the text entries represented in the document. In the situation there is not a high confidence match, such as a match failing to satisfy a threshold level of confidence, values for the document fields can left blank. Example document fields include document date such as an invoice date, document number such as an invoice number, item quantity, item amount, total amount, etc.

In an embodiment, the models and/or features for the models can correspond to one or more task performers and/or task validators. The models and features can correspond to an individual measurable property, characteristic, or performance metric of a task performer and/or task validator. For example, the properties, characteristics, or performance metrics can correspond to system efficiency, lag time, client confidentiality, resource performance, resource response rates, etc. The features in various embodiments can be described by a feature vector.

The models and features can be used to optimize system performance. For example, models of task performers and/or task validators, and/or other smart systems and/or resources can be used to optimally assign tasks to an appropriate resource.

A model and feature(s) of a task performers and task validator can be generated using historic activity data. The historic activity data can specify values for attributes representative of one or more tasks completed by a task performer and/or task validator, accuracy data for one or more tasks, timing data for one or more tasks, idle time data, active time data, etc. The activity data can be obtained from task performer/task validator log records, organization records, and the like. Activity data for each task performer/task validator can be used to train a plurality of models and generate a plurality of features of the models for respective task performer/task validator. In an example, a trained model or features for the trained model can be used to predict a likelihood of successfully completing a task, such as identifying text in an image. In another example, a trained model or features for the trained model can be used to generate an accuracy score for completing a task, such as identifying relevant text in an image. Training system is described in greater detail in FIG. 6.

When using human task performers and human task validators, client device(s) permit users to receive tasks and submit responses to the tasks. The client device(s) can be used to access task performer accounts 240 and/or validation accounts 247. Client devices may include, generally, a computer or computing device including functionality for communicating (e.g., remotely) over a network 250. Data may be collected from client devices, and data requests may be initiated from each client device. Client device(s) may be a server, a desktop computer, a laptop computer, personal digital assistant (PDA), a smart phone or other cellular or mobile phone, or mobile gaming device, among other suitable computing devices. Client devices may execute one or more client applications, such as a web browser (e.g., Microsoft Windows Internet Explorer, Mozilla Firefox, Apple Safari, Google Chrome, and Opera, etc.), or a dedicated application to submit user data, or to make prediction queries over a network 250.

In particular embodiments, each client device may be an electronic device including hardware, software, or embedded logic components or a combination of two or more such components and capable of carrying out the appropriate functions implemented or supported by the client device. For example and without limitation, a client device may be a desktop computer system, a notebook computer system, a netbook computer system, a handheld electronic device, or a mobile telephone. The present disclosure contemplates any client device. A client device may enable a network user at the client device to access the network 250. A client device may enable its user to communicate with other users at other client devices.

A client device may have a web browser, such as MICROSOFT INTERNET EXPLORER, GOOGLE CHROME or MOZILLA FIREFOX, and may have one or more add-ons, plug-ins, or other extensions, such as TOOLBAR or YAHOO TOOLBAR. A client device may enable a user to enter a Uniform Resource Locator (URL) or other address directing the web browser to a server, and the web browser may generate a Hyper Text Transfer Protocol (HTTP) request and communicate the HTTP request to server. The server may accept the HTTP request and communicate to the client device one or more Hyper Text Markup Language (HTML) files responsive to the HTTP request. The client device may render a web page based on the HTML files from server for presentation to the user. The present disclosure contemplates any suitable web page files. As an example and not by way of limitation, web pages may render from HTML files, Extensible Hyper Text Markup Language (XHTML) files, or Extensible Markup Language (XML) files, according to particular needs. Such pages may also execute scripts such as, for example and without limitation, those written in JAVASCRIPT, JAVA, MICROSOFT SILVERLIGHT, combinations of markup language and scripts such as AJAX (Asynchronous JAVASCRIPT and XML), and the like. Herein, reference to a web page encompasses one or more corresponding web page files (which a browser may use to render the web page) and vice versa, where appropriate.

The client device may also include an application that is loaded onto the client device. The client device obtains data from the network 250 and displays it to the user within the application interface.

Exemplary client devices are illustrated in some of the subsequent figures provided herein. This disclosure contemplates any suitable number of client devices, including computing systems taking any suitable physical form. As example and not by way of limitation, computing systems may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, or a combination of two or more of these. Where appropriate, the computing system may include one or more computer systems; be unitary or distributed; span multiple locations; span multiple machines; or reside in a cloud, which may include one or more cloud components in one or more networks. Where appropriate, one or more computing systems may perform without substantial spatial or temporal limitation one or more steps of one or more methods described or illustrated herein. As an example, and not by way of limitation, one or more computing systems may perform in real time or in batch mode one or more steps of one or more methods described or illustrated herein. One or more computing system may perform at different times or at different locations one or more steps of one or more methods described or illustrated herein, where appropriate.

Network cloud 250 generally represents a network or collection of networks (such as the Internet or a corporate intranet, or a combination of both) over which the various components illustrated in FIG. 2 (including other components that may be necessary to execute the system described herein, as would be readily understood to a person of ordinary skill in the art). In particular embodiments, network 250 is an intranet, an extranet, a virtual private network (VPN), a local area network (LAN), a wireless LAN (WLAN), a wide area network (WAN), a metropolitan area network (MAN), a portion of the Internet, or another network 250 or a combination of two or more such networks 250. One or more links connect the systems and databases described herein to the network 250. In particular embodiments, one or more links each includes one or more wired, wireless, or optical links. In particular embodiments, one or more links each includes an intranet, an extranet, a VPN, a LAN, a WLAN, a WAN, a MAN, a portion of the Internet, or another link or a combination of two or more such links. The present disclosure contemplates any suitable network 250, and any suitable link for connecting the various systems and databases described herein.

The network 250 connects the various systems and computing devices described or referenced herein. In particular embodiments, network 250 is an intranet, an extranet, a virtual private network (VPN), a local area network (LAN), a wireless LAN (WLAN), a wide area network (WAN), a metropolitan area network (MAN), a portion of the Internet, or another network 250 or a combination of two or more such networks 250. The present disclosure contemplates any suitable network 250.

One or more links couple one or more systems, engines or devices to the network 250. In particular embodiments, one or more links each includes one or more wired, wireless, or optical links. In particular embodiments, one or more links each includes an intranet, an extranet, a VPN, a LAN, a WLAN, a WAN, a MAN, a portion of the Internet, or another link or a combination of two or more such links. The present disclosure contemplates any suitable links coupling one or more systems, engines or devices to the network 250.

In particular embodiments, each system or engine may be a unitary server or may be a distributed server spanning multiple computers or multiple datacenters. Systems, engines, or modules may be of various types, such as, for example and without limitation, web server, news server, mail server, message server, advertising server, file server, application server, exchange server, database server, or proxy server. In particular embodiments, each system, engine or module may include hardware, software, or embedded logic components or a combination of two or more such components for carrying out the appropriate functionalities implemented or supported by their respective servers. For example, a web server is generally capable of hosting websites containing web pages or particular elements of web pages. More specifically, a web server may host HTML files or other file types, or may dynamically create or constitute files upon a request, and communicate them to clients devices or other devices in response to HTTP or other requests from clients devices or other devices. A mail server is generally capable of providing electronic mail services to various clients devices or other devices. A database server is generally capable of providing an interface for managing data stored in one or more data stores.

In particular embodiments, one or more data storages may be communicatively linked to one or more servers via one or more links. In particular embodiments, data storages may be used to store various types of information. In particular embodiments, the information stored in data storages may be organized according to specific data structures. In particular embodiment, each data storage may be a relational database. Particular embodiments may provide interfaces that enable servers or clients to manage, e.g., retrieve, modify, add, or delete, the information stored in data storage.

The system may also contain other subsystems and databases, which are not illustrated in FIG. 2, but would be readily apparent to a person of ordinary skill in the art. For example, the system may include databases for storing data, storing features, storing outcomes (training sets), and storing models. Other databases and systems may be added or subtracted, as would be readily understood by a person of ordinary skill in the art, without departing from the scope of the invention.

Generally, the techniques disclosed herein may be implemented on hardware or a combination of software and hardware. For example, they may be implemented in an operating system kernel, in a separate user process, in a library package bound into network applications, on a specially constructed machine, on an application-specific integrated circuit (ASIC), or on a network interface card.

Software/hardware hybrid implementations of at least some of the embodiments disclosed herein may be implemented on a programmable network-resident machine (which should be understood to include intermittently connected network-aware machines) selectively activated or reconfigured by a computer program stored in memory. Such network devices may have multiple network interfaces that may be configured or designed to utilize different types of network communication protocols. A general architecture for some of these machines may be described herein in order to illustrate one or more exemplary means by which a given unit of functionality may be implemented. According to specific embodiments, at least some of the features or functionalities of the various embodiments disclosed herein may be implemented on one or more general-purpose computers associated with one or more networks, such as for example an end-user computer system, a client computer, a network server or other server system, a mobile computing device (e.g., tablet computing device, mobile phone, smartphone, laptop, or other appropriate computing device), a consumer electronic device, a music player, or any other suitable electronic device, router, switch, or other suitable device, or any combination thereof. In at least some embodiments, at least some of the features or functionalities of the various embodiments disclosed herein may be implemented in one or more virtualized computing environments (e.g., network computing clouds, virtual machines hosted on one or more physical computing machines, or other appropriate virtual environments).

Figure 3:
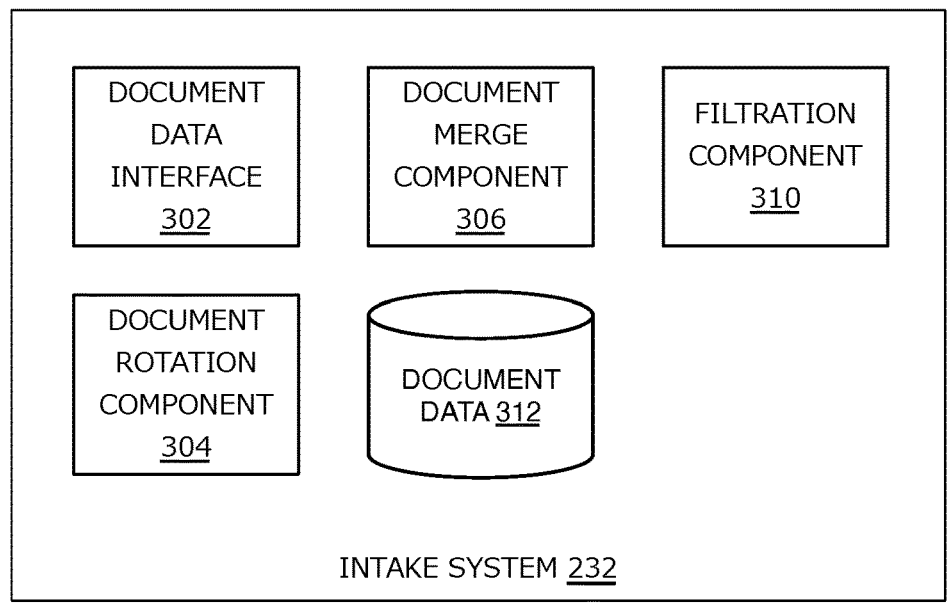
FIG. 3 illustrates an example of an intake system for a collaborative text detection and text recognition service in accordance with an embodiment.

FIG. 3 illustrates an example of an intake system for a collaborative text detection and text recognition service in accordance with an embodiment. In this example, intake system 232 can include document data interface 302, document rotation component 304, document merge component 306, and filtration component 310. Other components and interfaces may be used, as would be readily understood by a person of ordinary skill in the art, without departing from the scope of the embodiments described herein.

It should be noted that although document data store 312 is illustrated within intake system 232, it may reside inside or outside intake system 232, as would be readily understood to a person or ordinary skill in the art. Exemplary data stores include a database for storing document data, a database for storing vendor information, a database for storing models, etc. Other databases may be used, as would be readily understood to a person of ordinary skill in the art, without departing from the scope of the embodiments described herein. It should be further noted that although the data stores are shown as separate data stores, data from the data stores can be maintained across fewer or additional data stores. The data stores can be maintained locally or remote the components described herein. For example, a third-party can maintain some of the data stores or all of the data stores, among other such options.

Intake system 232 is operable to receive through document data interface 302 one or more documents (also referred to as document data). Receiving document data can include receiving images that include representations of documents. The documents may include invoices, personal documents, government documents, research papers, among other such documents described herein and known in the art.

Document data interface 302 may include a data interface and service interface configured to periodically receive documents, requests, and/or any other relevant information to facilitate collaborative text detection and recognition and display of such information. In an example, a database server or other appropriate component is generally capable of providing an interface for managing data stored in one or more data stores. In an embodiment, document data interface 302 can include any appropriate components known or used to receive requests or other data from across a network, such as may include one or more application programming interfaces (APIs) or other such interfaces for receiving such requests and/or data, including but not limited to, data scrapes, API access, etc. In a specific example, document data interface 302 communicates with user devices, data store 312, or other repositories or devices to obtain document data.

When document data is received, intake system 232 processes and stores the document data into an appropriate database. For example, the document data can be stored in document data store 312 or other appropriate data store. In an embodiment, document data can be stored in a format that can be consumed by one or more other components. For example, this may include but is not limited to a flat file, non-relational or relational database, or any other readily available electronic medium.

The document data can be processed using document rotation component 304, document merge component 306, document filtration component 310, among other such components to organize the document data.

Document rotation component 304 utilizes one or more document page rotation techniques to orientate one or more pages represented in the document data to a reference orientation. The reference orientation can include an orientation where text on the pages is orientated in substantially the same direction. More specifically, in accordance with an embodiment, document rotation component 304 is operable to analyze image data comprising a representation of one or more documents. The documents may comprise one or more pages. Document rotation component attempts to auto rotate pages automatically and align the pages. This can include, for example, first optimizing the image quality, by, for example, cropping the receipts pictures, correcting perspective and improving the contrast. After, the documents and images can be converted to text using an optical character recognition (OCR) approach. If the document is a PDF, it can first be converted into an image and then into text. This creates a searchable document and reveals what the text orientation is. In the situation the text is to be read left to right, document rotation component 304 can rotate pages accordingly. In certain situations, it may be desired to rotate the text right to left, such as in the situation where the document is in a language where text is read right to left. Accordingly, a machine learning classifier can be utilized to determine the country of origin and language of the document. Once the country of origin and/or language of the document is determined, the image or document can be rotated accordingly.

The rotated documents can be maintained at a task performer queue associated with a task performer network (e.g., task performer network 243) for processing, such as to flag certain documents, retrieve document data, etc. In an example, a task performer associated with a task performer account may flag documents that include sensitive data, such as personally identifiable information (PII) or other information that could potentially be used to identify a particular person, including, for example, a full name, a social security number, driver's license number, bank account number, passport number, email address, etc. In another example, a task performer may flag documents that are not a particular document type or are otherwise of an unauthorized document type. For example, in the situation where invoice documents are to be analyzed, a task performer may flag documents that are not invoices. In yet another example, a task performer may retrieve document field values from one or more document fields.

Task performer information can be received from the task performer network at intake system 232. The task performer information can include tags identifying document pages to merge, documents to remove or redact, etc.

Document merge component 306 can analyze (e.g., scan) the task performer information for a merge document tag or other information indicating documents to be merged. In this example, the merge document tag may indicate one or more pages to be merged and/or sets of one or more pages to be merged. Document merge component 306 can then merge pages associated with an appropriate tag. For example, document merge component 306 can merge pages associated with a merge document tag to generate a merged document. In another example, document merge component 306 can merge a first set of pages associated with a first merge document tag to generate a first merged document and a set second set of pages associated with a second merge document tag to generate a second merged document. In this example, the process may repeat for pages associated with a respective merge document tag.

Filtration component 310 can analyze the task performer information for a PII tag, or other information indicating documents, e.g., document pages, contain PII. In this example, the PI tag may indicate pages to remove or redact. Filtration component 310 may then automatically remove pages including PI or redact portions of the pages including PII.

In certain embodiments, document merge component 306, filtration component 310, or another appropriate component can execute at the task performer network or task validator network. For example, a task validator or a task performer can remove pages associated with a PI tag, redact information associated with a PI tag, or a combination thereof. The processed pages or information indicating the changes can be provided to intake system 232 or another appropriate component, and/or stored in document data store 312.

Figure 4:
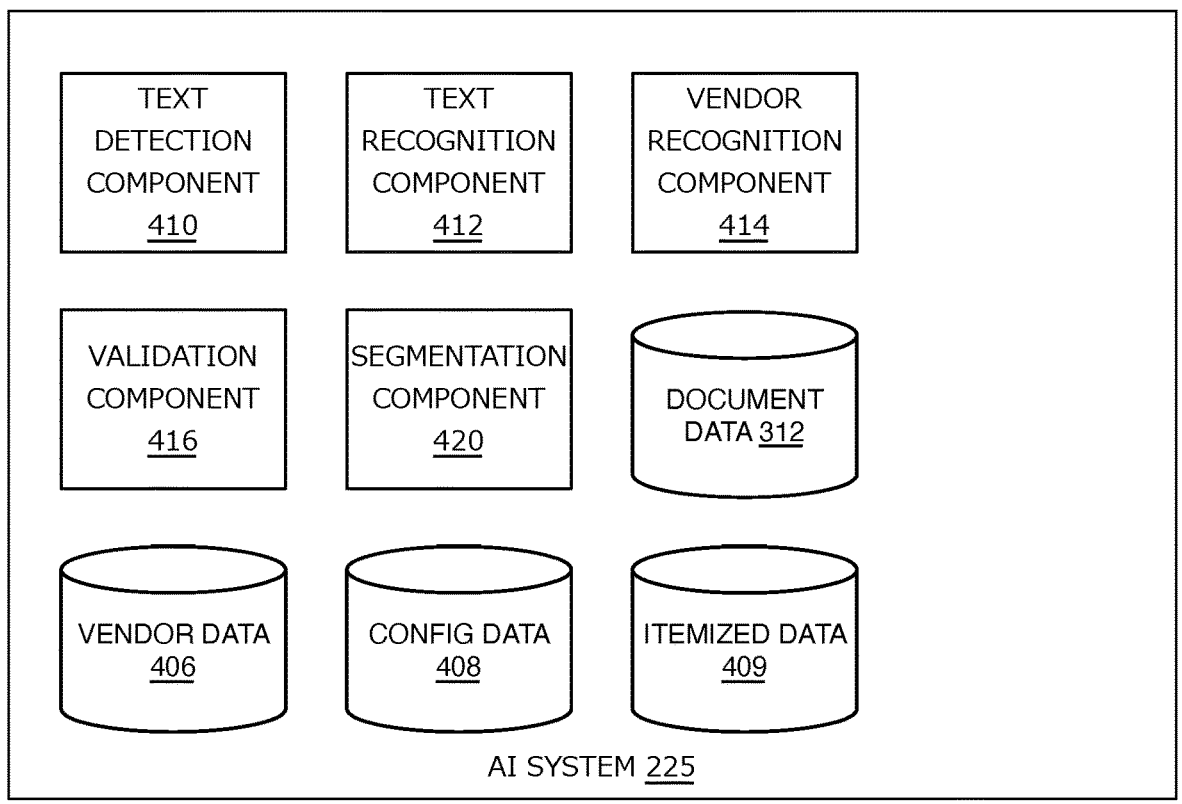
FIG. 4 illustrates an example of an AI system of a collaborative text detection and text recognition service in accordance with an embodiment.

FIG. 4 illustrates an example of an AI system of a collaborative text detection and text recognition service in accordance with an embodiment. In this example, AI system 225 is operable to perform one or more machine tasks, including, for example, task generation, text detection, text recognition, vendor recognition, data validation, text segmentation, etc. AI system 225 can include text detection component 410, text recognition component 412, vendor recognition component 414, validation component 416, and segmentation component 420. Other components may be used, as would be readily understood by a person of ordinary skill in the art, without departing from the scope of the embodiments described herein.

Vendor recognition component 414 is operable to identify a vendor associated with a document. In the situation a vendor is identified, e.g., a vendor identification confidence score satisfies a threshold confidence score, document data (also known as data entry values or document entry values) in one or more document fields can be automatically retrieved and utilized in one or more processes. A vendor identification confidence score can quantify a degree of similarity between a query document and a plurality of candidate vendor templates. In the above referenced example, a vendor may be associated with a vendor template. A vendor template can comprise a model of a document. A vendor template can be generated using machine learning, manually generated, or a combination thereof. An example document is an invoice. In this example, the invoice can include one or more document fields, such as a date field, a document number field such as an invoice number field, an item quantity field, an item cost field, a total cost field, an item description field, etc. The document fields can be populated with document entry values, such as a number of items in the quantity field, the cost per item in the amount field, the total cost in the total amount field, text for the description field, etc. The model includes information identifying a location of each of the document fields. In this manner, when a vendor is recognized for a document, because the location of one or more document fields in the document is known, the data in those fields can be retrieved and associated with the corresponding document field, and utilized in one or more processes. For example, because the location of the quantity field is known, document data corresponding the number of items can be automatically retrieved. As will be described further herein, the data in those fields can be retrieved utilizing text detection component 410 and text recognition component 412.

Vendor recognition component 414 can utilize, for example, a support vector machine SVM vendor detection algorithm or other learning model to identify the vendor associated with a document. For example, an image of a document can be received. The image can be evaluated by vendor recognition component 414 to attempt to match the image of the document to a stored image of vendor templates, where each potential match can be associated with a vendor identification confidence score. The vendor template associated with, for example, a highest vendor template can be selected.

In certain embodiments, information (e.g., a vendor ID, a vendor user name, etc.) identifying the vendor of a document may be received. In this example, the identifying information can be used to verify whether the matched vendor template, e.g., the vendor template associated with the highest confidence score, corresponds to the vendor specified by the identifying information. In this example embodiment, the vendor templates can be associated with a respective vendor. For example, the vendor templates can be associated with a vendor ID. The vendor ID associated with the matched vendor template can be compared to the received vendor ID. In the situation the vendor ID associated with the matched vendor templated matches the received vendor ID, the vendor template can be verified, and utilized in accordance with embodiments described herein. In the situation the vendor ID associated with the matched vendor templated does not match the received vendor ID, the matched vendor template is not used, and the process proceeds.

For example, in the situation where a vendor is not identified, e.g., a vendor identification confidence score fails to satisfy a threshold confidence score, or the vendor ID associated with the matched vendor templated does not match the received vendor ID, values for the document fields can left blank.

In the situation there is a high confidence match, such as a match satisfying a threshold level of confidence, text entries for document fields or other data fields represented in the document can be retrieved and used in other processes. For example, text detection component 410 can utilize at least one text detection algorithm to detect text in the received image. This can include, for example, identifying regions ("textual regions" in the image that may include representations of text. The textual regions can be analyzed using text recognition component 412 to recognize the text in those regions. Thereafter, the text entries can be presented to a task performer to perform one or more tasks. In an example, the text entries can be presented to a task performer to verify that the retrieved text entries match the text entries represented in the document.

Segmentation component 420 is operable to retrieve document fields and document field values and cause those values to be presented to a task performer for processing. For example, in the situation a vendor is identified, document field values in one or more document fields can be automatically retrieved. This can include, for example, retrieving subgroups of recognized text associated with those document fields.

A request including a document "summary task" or another appropriate task can then be submitted to a task performer queue associated with a task performer network (e.g., task performer network 243). The request can be associated with images of the document, task instructions for the type of task, any document field and document field values, etc. An example task is a document summary task, which instructs the task performer to review, modify, and/or edit document data, including, for example, vendor name, invoice number, invoice amount, invoice date, etc. Other tasks may be included with the request, or submitted as a separate request, including, for example, a "detail task," a "review task," etc. The detail task instructs a task performer to review and update (if needed) document data such as, for example, item product code, item description, item quantity, item rate, item amount, etc. The review task instructs a task validator to review information received from the task performer.

Task performer information (also referred to as a human or AI task performer information) can be received at validation component 416. The task performer information can include information in response to a task. For example, the task performer information can include information in response to the detail task, such as new or updated text corresponding to the item produce code, the item description, etc.

Validation component 416 validates the task performer information. For example, in the situation the task performer information includes an item quantity, an item rate, an item amount, validation component 416 can determine the product of the item quantity and the item rate and compare the product of the item quantity and the item rate to the recognized item amount. In the situation the product of the item quantity and the item rate is not the same as the item amount, then the performer information and/or document information can be manually reviewed by a task validator (e.g., a human and/or AI task validator). In an example, the task performer information and document information can be maintained at a task validator queue associated with a task validator network. A task validator can review/validate document entries for the item quantity, item rate, and item amount. The task validator can make appropriate changes to these document entries in a task reviewer/validator pane or other appropriate interface or overlay. In an example, the task validator can adjust one or more document entries associated with one of the item quantity, item rate, or item amount, and/or perform another task validation action. The changes can be stored in document data store 312 or other data store.

In another example, validation component 416 can determine whether the items included in the document are new. In this example, validation component 416 can compare items represented in the document to a list of previously recognized items for a vendor and in certain embodiments to a global list of previously recognized items. Items that have not been previously recognized (e.g., new items) can be flagged for further processing. For example, the performer information and document information can be maintained at a task validator queue associated with a task validation network. For the new items, item codes can be automatically generated and a task validator can review the new items and item codes. The new item entries can be highlighted or otherwise emphasized by, for example, bolding the text entries, underlining the text entries, presenting a bounding box around document fields, changing the color of the text entries, changing the font type or font size of the text entries, etc.

In yet another example, validation component 416 can determine whether an item has changed in price. In this example, validation component 416 can compare the price of any items represented in the document with respective past prices for those items. Items that have changed in price can be flagged for further processing. For example, the performer information and document information can be maintained at a task validator queue associated with a task validation network. A task validator can review/validate the change in price and enter appropriate notes and/or information for the change in price. The new price information can be stored in document data store 312 or other appropriate data store.

In the situation the product of the item quantity and the item rate is the same as the item amount, and/or no flags are detected, the task performer information and/or the task validator information can be stored in itemized data store 409 or another appropriate data store. For example, the task performer information and/or task validator information can be stored as itemized data. Itemized data can include item level data, such as item product code, item description, item quantity, item rate, item amount, pack size, etc. The itemized data can be used in one or more other systems, including, for example, an accounting system, a purchasing system, an AI training system, and the like.

In certain embodiments, specific item level data may be obtained. For example, the document field values corresponding to item level data can be specified by a vendor configuration file. That is, a configuration file can specify document fields associated with regions of text to be retrieved. Advantageously, vendors may indicate itemized data to be obtained by specifying such data in the vendor configuration file. The vendor configuration file can be updated to select and/or deselect item level data to be obtained. Vendor configuration files can be stored in configuration data store 408 or another appropriate data store.

Figure 5:
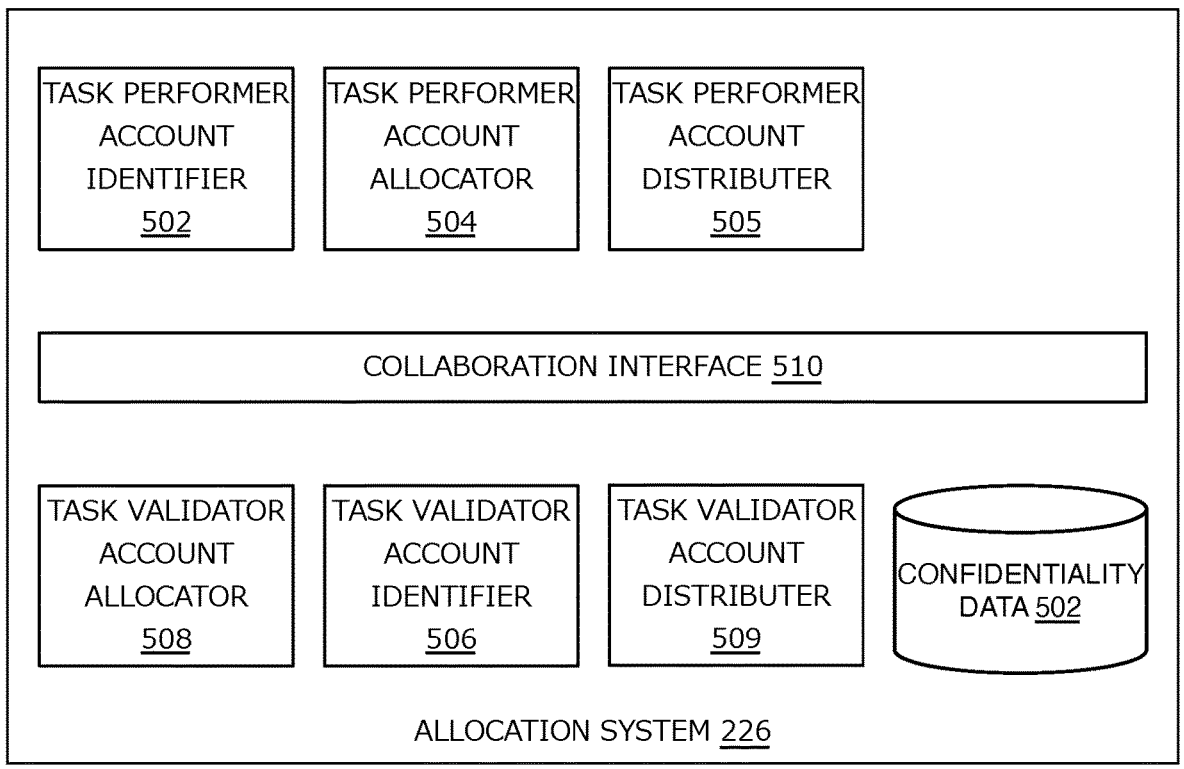
FIG. 5 illustrates an example of an allocation system of a collaborative text detection and text recognition service in accordance with an embodiment.

FIG. 5 illustrates an example of allocation system 226 in accordance with an embodiment. In this example, allocation system 226 can include task performer account identifier 502, task performer account allocator 504, task performer account distributer 505, task validator account identifier 506, task validator account allocator 508, task validator account distributer 509, and collaboration interface 510. Other components and interfaces may be used, as would be readily understood by a person of ordinary skill in the art, without departing from the scope of the embodiments described herein.

Allocation system 226 matches one or more task performer accounts and/or one or more task validator accounts with one or more tasks via collaboration interface 510. Collaboration interface 510 can include application programming interfaces (APIs) or other exposed interfaces enabling a task to be maintained at an appropriate network such as a task performer network and/or a task validator network. Collaboration interface 510 in this example can also include other components as well, such as at least one Web server, routing components, load balancers, and the like.

In one embodiment, the tasks may be grouped into one or more groupings. As described, the tasks can include, for example, a merge task, an automated vendor detection task, a summary task, a detail task, an automated validations task, a manual review task, an automated vendor connecting task, etc. It should be noted these are example tasks and embodiments described herein are not limited by these tasks.

The task performer account identifier 502 can obtain an inventory of task performer accounts associated with one or more task performer networks. The inventory of task performer accounts may be used to assign tasks to task performer accounts in accordance with selection criteria. For example, the tasks may be assigned based on an association with one or more types of tasks to be performed, confidentiality obligations associated with document types or vendors, etc. In an embodiment, task performer account identifier 502 may identify all task performer accounts that may be capable of performing the task. In other embodiments, task performer account identifier 502 identifies accounts and/or user permissions that are provisioned or enabled to perform the task. Task performer account identifier 502 may further identify task performer accounts associated with those logins/accounts that are available and online to perform the tasks.

Task validator account identifier 506 and task validator account allocator 508 assign tasks to one or more task validator accounts. In one embodiment, task validator account identifier 506 obtains an inventory of task validator accounts associated with one or more task validator networks. The inventory of task validators may be used to assign tasks to one or more task validator accounts in accordance with selection criteria. For example, the tasks may be assigned based on an association with one or more types of tasks to be reviewed, confidentiality obligations associated with document types or vendors, types of flags identified, etc. In an embodiment, task validator account identifier 506 may identify all task validator accounts that may be capable of reviewing task results from the task performer accounts. In other embodiments, task validator account identifier 506 identifies accounts and/or user permissions that are provisioned or enabled to review task results. Task validator account identifier 506 may further identify task validator accounts associated with those logins/accounts that are available and online to perform the tasks.

Task performer account allocator 504 may assign task performer accounts to tasks based on a variety of factors, including one or more of, but not limited to: confidentiality/access control permissions, availability to perform, length of queue, ability/expertise to provide an effective response, available computing resources and network throughput, etc. Task validator account allocator 508 may assign task validator accounts to review task responses based on a variety of factors, including one or more of, but not limited to: confidentiality/access control permissions, availability to perform, length of queue, ability/expertise to provide an effective response, available computing resources and network throughput, etc.

Confidentiality data store 502 may be accessed by task performer account allocator 504 and/or task validator account allocator 508 to make assignment decisions based on permissions related to confidentiality. In one embodiment, task performer account allocator 504 and/or task validator account allocator 508 may access and/or reference confidentiality data store 502 and may assign tasks to task performers and/or task validators that have the same access permissions to a vendor. For example, confidentiality data store 502 can include confidentiality parameters comprised of information about whether certain task performers and/or certain task validators may respond/review certain tasks which may be associated with a particular vendor account corresponding to a vendor. For example, certain task performers and/or task validators may be associated with a vendor and/or organization, who may only want to share documents with certain other task performers and/or task validators. In some instances, some vendors may require task performers and/or task validators to have certain clearances or qualifications. In certain instances, some vendors may require that task performers and/or task validators who respond/review their tasks may not respond/review, for example, competitors' tasks. Instances of these rules may be provided in the confidentiality parameters.

In accordance with an embodiment, allocation system 226 can function to ensure that the tasks being performed by the task performers and/or task validators are distributed in accordance with desired parameters or selection criteria. Allocation system 226 is operable to assign and reassign tasks in order to optimize system performance along a variety of different performant dimensions, including, but not limited to improving system efficiency, reducing task performer and/or task validator idle time, improving triage outcomes, reducing data processing loads, maintaining client confidentiality, etc.

For example, task performer account identifier 502 and task validator account identifier 506 can determine the tasks which are being performed. More specifically, task performer account identifier 502 and task validator account identifier 506 can determine the number of tasks that each task performer and task validator is performing, the type of tasks which each task performer and task validator is performing, the time required to complete each task, etc. From such variables, task performer account identifier 502 and task validator account identifier 506 can identify if some task performers and task validators are performing more tasks than other task performers and task validators or are performing tasks that they are no longer equipped to handle.

In addition, task performer account identifier 502 and task validator account identifier 506 can determine if one or more of the task performers and/or task validators are assigned more tasks which take much longer to complete than the other task performers and/or task validators. Accordingly, task performer account identifier 502 and task validator account allocator 508 can determine if the task distribution among the task performers and the task validators is uneven or disproportionate. As a result, task performer account identifier 502 and task validator account allocator 508 can inform task performer account distributer 505 and task validator account distributer, respectively, that the tasks between the task performers and/or the task validators should be redistributed.

Task performer account distributer 505 can redistribute the tasks among the task performers to ensure that the tasks are evenly distributed and/or distribute task to additional task performers and redistribute the tasks among the task performers. Moreover, task validator account distributer 509 can ensure that the number of tasks each task validator is working on, the time spent on each task, and the number of requests for each task validator are evenly distributed.

In various embodiments, an account profile associated with each of the task performers and task validators may also be used to redistribute the tasks. For example, for each user profile (hereinafter also referred to as "resource profile," a model and features for the model that specify attributes of a task performer or a task validator can be determined. Based on the selection criteria and features for task performer and/or task validator, a task performer and/or a task validator can be selected and the task assigned.

Figure 6:
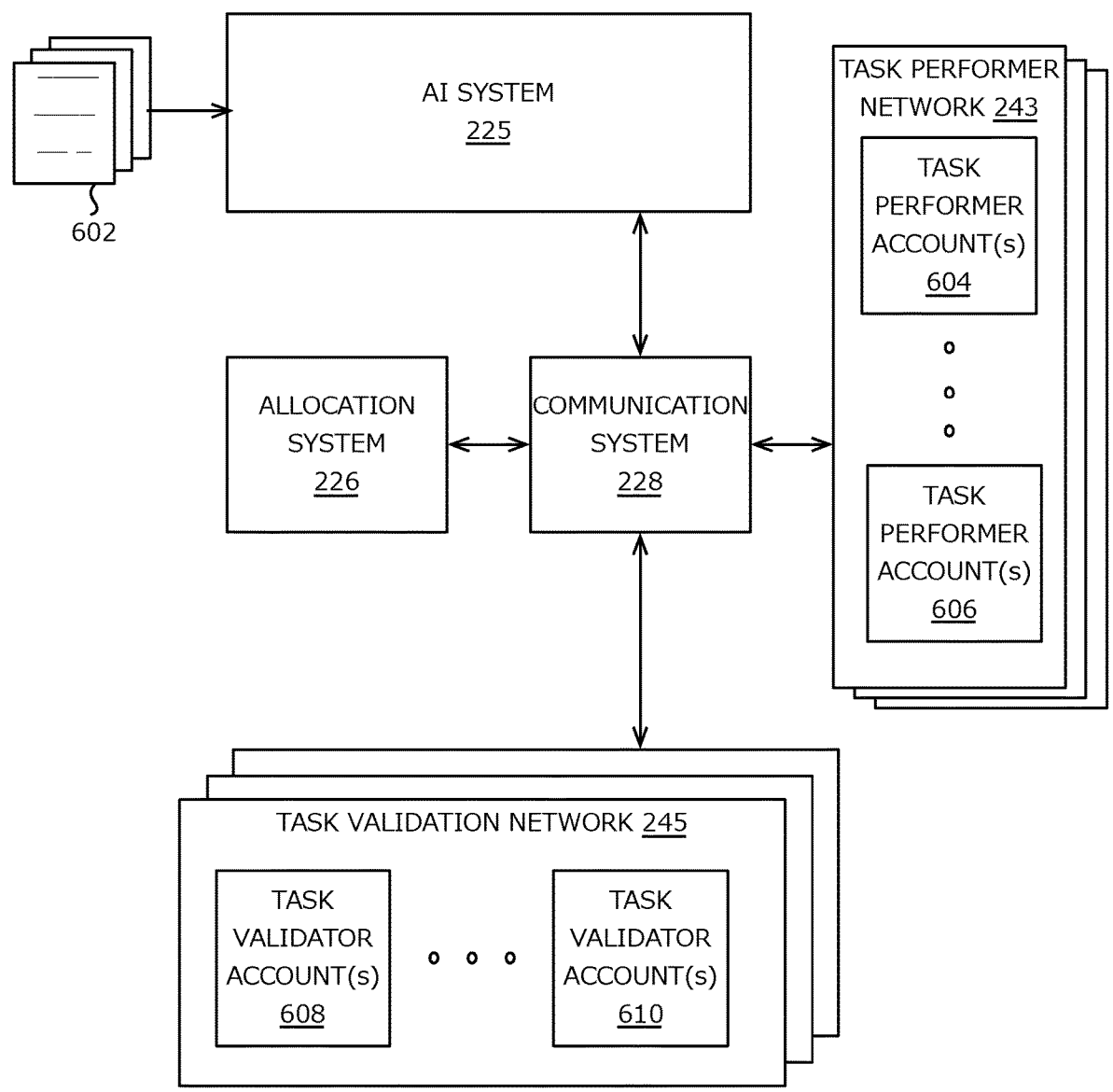
FIG. 6 illustrates an example of assigning and executing tasks in accordance with various embodiments.

FIG. 6 illustrates an example of assigning and executing tasks in accordance with various embodiments. In this example, document 602 is received at AI system 225. The document may be an invoice or other such document. As described, AI system 225 is operable to perform one or more machine performable tasks, including, for example, task generation, text detection, text recognition, vendor recognition, data validation, data segmentation, etc. Results of the machine performed tasks can be maintained at a task performer queue associated with one or more task performer network (e.g., task performer network 243) for processing, such as to flag certain documents, retrieve document data, etc. Similarly, results of the machine performed tasks and task performer networks can be maintained at a task validator queue associated with one or more task validator networks (e.g., task validation network 245) for additional processing. Tasks may be independently performed at AI system 225, task performer networks 243, and/or task validation network 245. For example, for a particular document, a machine performed task may be executed at AI system 225 during a first period of time, a task executed at task performer network 243 during a second period of time, and a task executed at task validation network 245 during a third period of time. In certain embodiments, different tasks may be executed at the same or different periods of time. Thereafter, the results from the different systems can be aggregated to generate, e.g., itemized data, training data, consensus string of text, etc.

When assigning tasks at one or more task performer network 243, an inventory of task performer accounts associated with one or more task performer networks 243 can be obtained. The inventory of task performer accounts can include task performer account 604 and task performer account 606. It should be noted that the task performer networks can be associated with one or more organizations. For example, task performer network 243 can be associated with a first organization and another task performer network can be associated with a second organization. In various embodiments, the first organization and the second organization can be associated with the same organization.

The inventory of task performer accounts may be used to assign tasks to appropriate task performers associated with the task performer networks. In an embodiment, all task performer accounts that may be capable of performing a task may be identified. In this example, task performer account 604 and task performer account 606 can be identified. In other embodiments, task performer accounts can be identified based on account permissions. Task performer accounts may be identified that associated with logins that are available and online to perform the tasks.

When assigning task at one or more task validation networks 245, an inventory of task validator accounts associated with one or more task validator networks 245 can be obtained. In this example, the inventory of task validator accounts can include task validator account 608 and task validator account 610. Similar to the task performer networks, the task validation networks can be associated with one or more organizations. For example, task validation network 245 can be associated with a first organization and another task validation network can be associated with a second organization. In various embodiments, the first organization and the second organization can be associated with the same organization.

The inventory of task validators may be used to assign tasks to appropriate task validators. For example, the tasks may be assigned based on an association with one or more types of tasks to be reviewed, confidentiality obligations associated with document types or vendors, types of flags identified, etc. In an example, all task validator accounts that may be capable of reviewing/validating task results from the task performer accounts may be identified. In this example, task validator account 608 and task validator account 610 may be identified. In other embodiments, task validator accounts can be identified based on account permissions that are provisioned or enabled to review task results or accounts associated with those logins/accounts that are available and online to perform the tasks.

Communication system 228 can assign tasks and/or groupings of tasks identified by allocation system 226 in order to optimize system performance along a variety of different performant dimensions specified by selection criteria, including, for example, improving system efficiency, reducing resourcing task performer idle time, reducing validation performer idle time, improving triage outcomes, reducing data processing loads, maintaining client confidentiality, in accordance with a cost structure, etc.

Communication system 228 can receive a task request from AI system 225. The task request can be associated with a task type and selection criteria. In an embodiment, selection criteria can also be referred to as and specify performant dimensions, goals, requirements, preferences, metrics or other information indicating performance goals. The task type can indicate whether the task is appropriate for a task performer or a task validator.

Communication system 228 can maintain the request at one of a task performer queue or a task validation queue. For example, communication system 228 may classify or otherwise identify the type of task as a task performer type task or a task validator type task. The classified (or labeled task) can be assigned to an appropriate resource. For example, in the situation the task is classified as a task performer type task, the task can be maintained at the task performer queue for processing by task performer account 604 or task performer account 606. In the situation the task is classified as a task validator type task, the task can be maintained at the task validator queue for processing by task validator account 608 or task validator account 610.

Thereafter, the task can be assigned to one of the task performer accounts or the task validator accounts based on the selection criteria. Specifically, the task can be assigned to one of the task performer accounts or the task validator accounts based on availability to respond, length of queue, ability/expertise to provide an effective response, available computing resources and network throughput, etc. In an embodiment, this can include, for example, analyzing the task performer queue and/or the task validator queue to determine how many tasks each task performer and/or task validator is handling, the time required to resolve each task, the number of tasks that each task performer and task validator is performing, and the complexity of each task that the task performers and task validators are receiving.

In another example, task performer accounts and task validator accounts can be associated with respective models and/or features for the models. The models and features can correspond to an individual measurable property, characteristic, or performance metric of a task performer and/or task validator. For example, the properties, characteristics, or performance metrics can correspond to system efficiency, lag time, client confidentiality, resource performance, resource response rates, etc. The features in various embodiments can be described by a feature vector.

The models and features can be used to optimize system performance. For example, models of task performers and/or task validators, and/or other smart systems and/or response resources can be used to optimally assign tasks to an appropriate resource.

A model and feature(s) of a task performers and task validator can be generated using historic activity data. The historic activity data can specify values for attributes representative of one or more tasks completed by a task performer and/or task validator, accuracy data for one or more tasks, timing data for one or more tasks, idle time data, active time data, etc. The activity data can be obtained from task performer/task validator log records, organization records, and the like. Activity data for each task performer/task validator can be used to train a plurality of models and generate a plurality of features of the models for respective task performer/task validator. In an example, a trained model or features for the trained model can be used to predict a likelihood of successfully completing a task, such as identifying text in an image. In another example, a trained model or features for the trained model can be used to generate an accuracy score for completing a task, such as identifying relevant text in an image.

The communication system 228 can cause the tasks to be presented in a graphical user interface or overlay that permit task performers and/or task validators to quickly and efficiently triage and respond to the tasks. In certain embodiments, the graphical user interface includes instructions to execute the tasks, recognized text, text input fields, accessibility elements such as bounding boxes, arrows, and other graphics, etc. Communication system 228 may classify the tasks and cause to be generated different user interfaces based on the type of tasks are classified. For example, if the task is a document merge task, then communication system 228 may generate information to present available document and document pages in such a way that the task may be completed. For example, a task performer can select pages to be merged, and the communication system or other appropriate system or component can cause the pages to be merged. A graphical user interface is described herein as being provided to a task performer and/or task validator, however, other types of communication may be provided without departing from the scope of the invention, including, but not limited to: written material such as code, instruction snippets, one or more two and/or three-dimensional images, video, audio/oral instructions, etc. In each instance the communication system 228 may translate the user input into instructions that can be presented to task performers and task validators.

Task performer information and task validator information can be received at communication system 228 and provided to AI system 225. Thereafter, the information can be stored as itemized data. The itemized data can be used in one or more other systems, including, for example, an accounting system, a purchasing system, an AI training system, and the like.

Figure 7A:
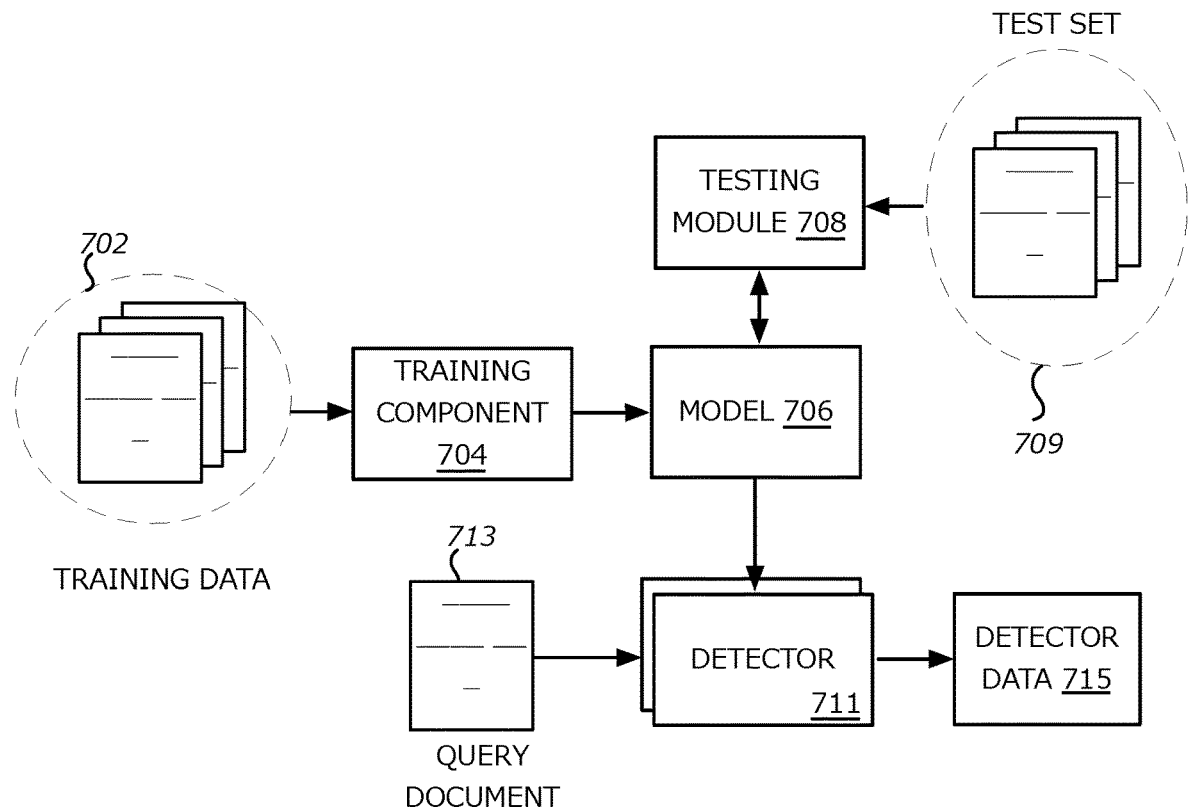
FIG. 7A illustrates an example approach to training a vendor detection model that can be utilized in accordance with various embodiments.

FIG. 7A illustrates an example approach to training a vendor detection model that can be utilized in accordance with various embodiments. In this example, document data including a set of images 702 is obtained that can be used to train one or more models (e.g., SVM models, neural networks) 706 or other machine learning-based algorithms to recognize vendors for various types of documents. The imaging data can include, for example, an image of a document, such as an invoice. It should be noted that the documents are not limited to invoices, and the documents may include other types of documents such as personal documents, government documents, research documents, etc. The imaging data can come from one or more sources, such as from the Internet, users including, for example, companies, vendors, and the like.

In order to function as training data for the models, at least some of the images will include (or be associated with) data that indicates a type or classification or vendor for the document represented in each image. For example, set of images 702 may comprise labelled imaging data. Labelled imaging data can include imaging data associated with metadata or other data that specifies a vendor a document is associated with. The classifications in at least some embodiments will be selected from a set of classifications, or sub-classifications, used to identify various vendors.

In some embodiments the set of images will be analyzed to determine which images include data sufficient to identify a vendor associated with the document represented in each of the images, and those images can be considered a training set to be used to train a model, at least some embodiments there is one model trained for each type of object, with multiple types of classifications of that type of object being possible outcomes from the network. In some embodiments, a portion of the training set will be retained as a testing set 709 to use to test the accuracy of the trained model. In this example, the training images are accessible to a training component 704 which can feed the images to model 706 in order to train the model. As mentioned, the image and classification data will be fed to the model so the model can learn features of documents associated with different classifications of documents. The network can then learn various combinations or relations of features for different classifications, such that when a query image is processed with the trained model the model can recognize the features and output the appropriate classification, although various other approaches can be utilized as well within the scope of the various embodiments.

In some embodiments the training images 702 are to be used as training data for a SVM algorithm or other learning model. As mentioned, the images can be classified, either when provided or through a classification analysis, to determine a primary classification, such as a particular vendor. Various other images provided by third party sources can be used for training as well as discussed and suggested elsewhere herein. The SVM can be trained using some or all of the designated training data. Once at least the initial training has completed, a testing module 708 can utilize the testing images 709 to test the trained SVM. Since the testing images already include classification data, the classifications generated by the SVM can be compared against that data to determine the accuracy of the SVM, both overall and for different types of documents. The testing images can also be used to further train the SVM. The results can be analyzed and if the results are acceptable, such as where the accuracy at least meets a minimum accuracy threshold for some or all of the classifications, the SVM can be provided to a detector 711, e.g., a vendor detector, that is able to accept query images 713 from various sources, such as end users, and generate classification data including vendor detection data that includes classifications 715 for documents represented in those images. As mentioned herein, such an approach can be used for a number of different purposes, including, for example, recognizing a vendor associated with the document, and automatically retrieving text entries for document fields or other data fields represented in the document.

Figure 7B:
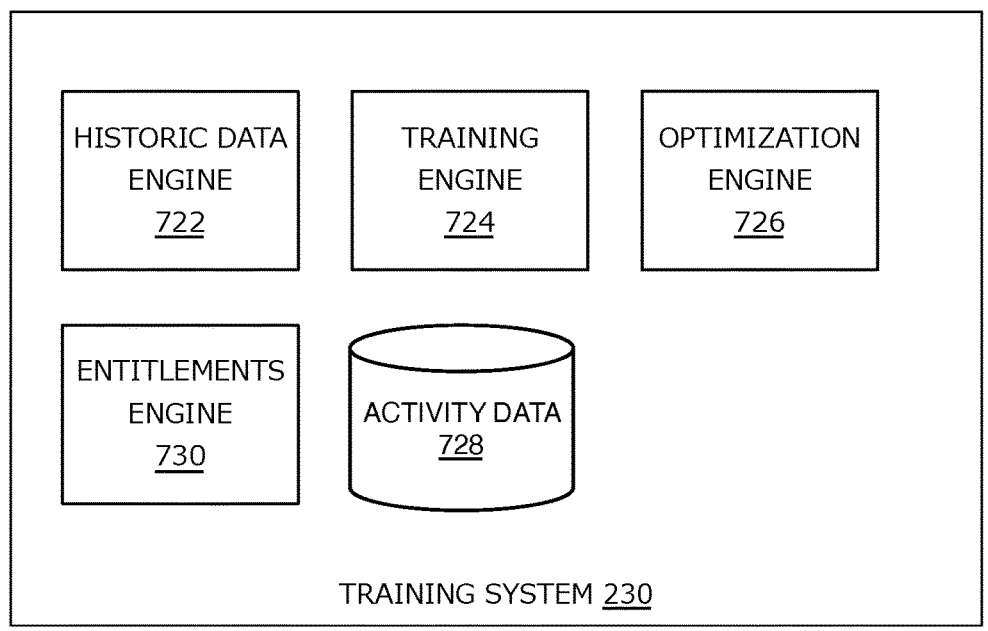
FIG. 7B illustrates an exemplary embodiment of a training system in accordance with an embodiment.

FIG. 7B illustrates an exemplary embodiment of training system 230 in accordance with an embodiment. In this example, training system 230 is operable to generate models and feature(s) task performers and/or task validators. The models and features of those models can be used to ensure that tasks are assigned to task performers and task validators in accordance with desired parameters or selection criteria. For example, the tasks can be assigned in order to optimize system performance. For example, models of task performers and/or task validators, and/or other smart systems and/or resources can be used to optimally assign tasks to an appropriate resource.

Training system 230 may include historic data engine 722, entitlements engine 730, training engine 724, and optimization engine 726. Other components and interfaces may be used, as would be readily understood by a person of ordinary skill in the art, without departing from the scope of the embodiments described herein.

Historic data engine 722 obtains activity data associated with task performers and activity data associated with task validators. In an example, the historic activity data can specify values for attributes representative of one or more tasks completed by a task performer and/or task validator, accuracy data for one or more tasks, timing data for one or more tasks, idle time data, active time data, etc. The activity data can be obtained from task performer/task validator log records, organization records, and the like. The log records can include, for example, log files specifying actions taken by the task performers and task validators, results of the actions, time stamps, etc. The log records can be analyzed to determine accuracy data for one or more tasks, timing data for one or more tasks, idle time data, active time data, etc. The activity data associated with the task performer and task validators can be stored in activity data store 728.

Entitlements engine 730 obtains selection criteria from an organization. In an embodiment, selection criteria can also be referred to as and specify performant dimensions, goals, requirements, preferences, metrics or other information indicating performance goals. The selection criteria can be received in the form of instructions such as a configuration file or other information indicating the selection criteria. The selection criteria may apply to a task performer and/or task validator. In the situation the selection criteria apply to a task performer and/or task validator, the selection criteria may specify, or include thresholds for task performer and/or task validator efficiency, task performer and/or task validator time thresholds, data processing load thresholds, throughput thresholds, etc. The selection criteria may specify an order of importance for individual selection criterion.

Entitlements engine 730 can analyze the selection criteria to identify selection criteria components. For example, in the situation the selection criteria apply to a task performer and/or task validator, a first component may include a requirement for confidentiality, a second component may include a requirement for throughput, and a third component may include a requirement for accuracy.

The selection criteria components in certain embodiments may be weighted. For example, a configuration file may indicate a level of importance for the selection criteria, which is described further below with respect to optimization engine 726. In short, the selection criteria can be associated with weighting assignments. The weighting assignments can be used to apply a weight value (e.g., an importance value or preference) to each of the selection criteria components. For example, weighting assignments may weight throughput more heavily than accuracy. The selection criteria components can be dynamically weighted. For example, the selection criteria components can be weighted based on the type of task. In an example, an organization may specify that when a particular type of task is generated, e.g., line item recognition, accuracy is weighted greater than throughput.

The configuration file in various embodiments may indicate an order of selection components to be satisfied when assigning a task to a task performer and/or task validator. In this example, individual selection components may be associated with a threshold. In an embodiment, a task performer and/or task validator that best satisfies the selection components can be selected. For example, a first selection component can be associated with a first threshold and a second selection component can be associated with a second threshold. Specifically, the first selection component can correspond with an experience level and the second selection component can correspond with a response time threshold. In the situation the first threshold is not satisfied, the system determines whether the second threshold is satisfied. That is, if it is determined none of the task performers and/or task validators satisfy the threshold experience level, a determination can be made whether a task performer and/or task validator satisfies the second threshold. In the situation the second threshold is satisfied, the task performer and/or task validator satisfying the threshold is selected. In the situation the second threshold is not satisfied, a default task performer and/or task validator can be selected or some other process can be initiated. If more than one task performer and/or task validator satisfies a threshold, the task performer and/or task validator associated with a better score may be selected. In certain embodiments, multiple resources may be selected to, for example, facilitate the training of task performers and/or task validators, resource scheduling, resource forecasting, etc. Training resources may include, for example, assigning a task to two or more task performers and/or task validators, where at least one task performer and/or task validator is configured to train the other task performer and/or task validator in executing to the task. Resource scheduling may include, for example, scheduling tasks to certain task performers and/or task validators so that other task performers and/or task validators are available to handle particular tasks. In this example, the best fit task performer and/or task validator may not be selected to ensure that task performer and/or task validator is available for other tasks.

Similar to resource scheduling, resource forecasting can include, for example, predicting future tasks and potential task performers and/or task validators to execute those tasks, and reserving those task performers and/or task validators for the predicted tasks. For example, AI system can utilize prediction models to predict the likelihood of future tasks based on incoming documents. For instance, the prediction models can be used to predict types of tasks and expected times for task completion. Based on predicted types of tasks and expected times, task performers and/or task validators can be reserved for those expected times to execute the tasks.

The selection criteria can dynamically change. For example, for a particular period of time, the selection criteria may include throughput and accuracy. In this example, during the period of time, throughput may be preferred and weighted more than accuracy. Further, there may be no criteria as to confidentiality and thus, no or reduced limitations on task performers and/or task validators. During a different time period, or for particular documents processed by the task performers and/or task validators, accuracy may be weighted over other selection criteria such as throughput. In this example, importance is placed on correctly processing a document. Further to this example, the selection criteria may limit the task performers and/or task validators allowed to execute a task. For example, task performers and/or task validators at a threshold experience level with particular permissions may be utilized while others that do not satisfy the threshold experience level and permissions are not utilized.

Training engine 724 is operable to build models and feature(s) for the models that specify performant dimensions of task performers and/or task validators. The models or feature(s) can be generated using historic activity data from data store 728. For example, a trained model can determine one of a number of features from the historic activity data. With respect to task performers and/or task validators, a trained model can be used to generate features that can be used to predict a likelihood of successfully completing a task. In this example, the trained model can include a value for a feature representing the speed of a task performer and/or task validator. The feature can be compared to an appropriate threshold to determine whether the speed of the task performer and/or task validator is sufficient.

In another example, a trained model can be used to generate features that can be used to predict an accuracy score for completing a task, such as extracting text. In this example, the trained model can include a value for a feature representing the accuracy of the task performer and/or task validator. The feature can be compared to an appropriate threshold to determine whether the accuracy level of the task performer and/or task validator is sufficient. The features in certain embodiments can be combined to generate a feature vector representing various features of the task performer and/or task validator. In yet another example, a trained model can be used to generate features that can be used to predict a likelihood of successfully resolving a task. In this example, the trained model can include a value for a feature representing the likelihood of successfully resolving a task. The feature can be compared to an appropriate threshold to determine whether the task performer and/or task validator will resolve the task. In another example, a trained model can be used to generate features that can be used to predict an amount of time to resolve a task. In yet another example, a trained model can be used to generate features to predict a likelihood of having to ask for assistance in resolving a task. In at least these examples, the trained models may represent values for features associated with the task performer and/or task validator and the features can be compared to an appropriate threshold to determine which task performer and/or task validator for selection. The features in certain embodiments can be combined to generate a feature vector representing various features of the task performer and/or task validator.

Optimization engine 726 is configured to update models and/or features. For example, the models and/or features may be updated upon the completion of a task, upon completion of a number of tasks, in response to an event such as going offline or online of a task performer and/or task validator, with respect to an interval of time, or a combination thereof. In an embodiment, updating models and/or features can include analyzing activity data and updating the numerical features that represent or correspond to selection criteria for task performers and/or task validators.

Figure 8:
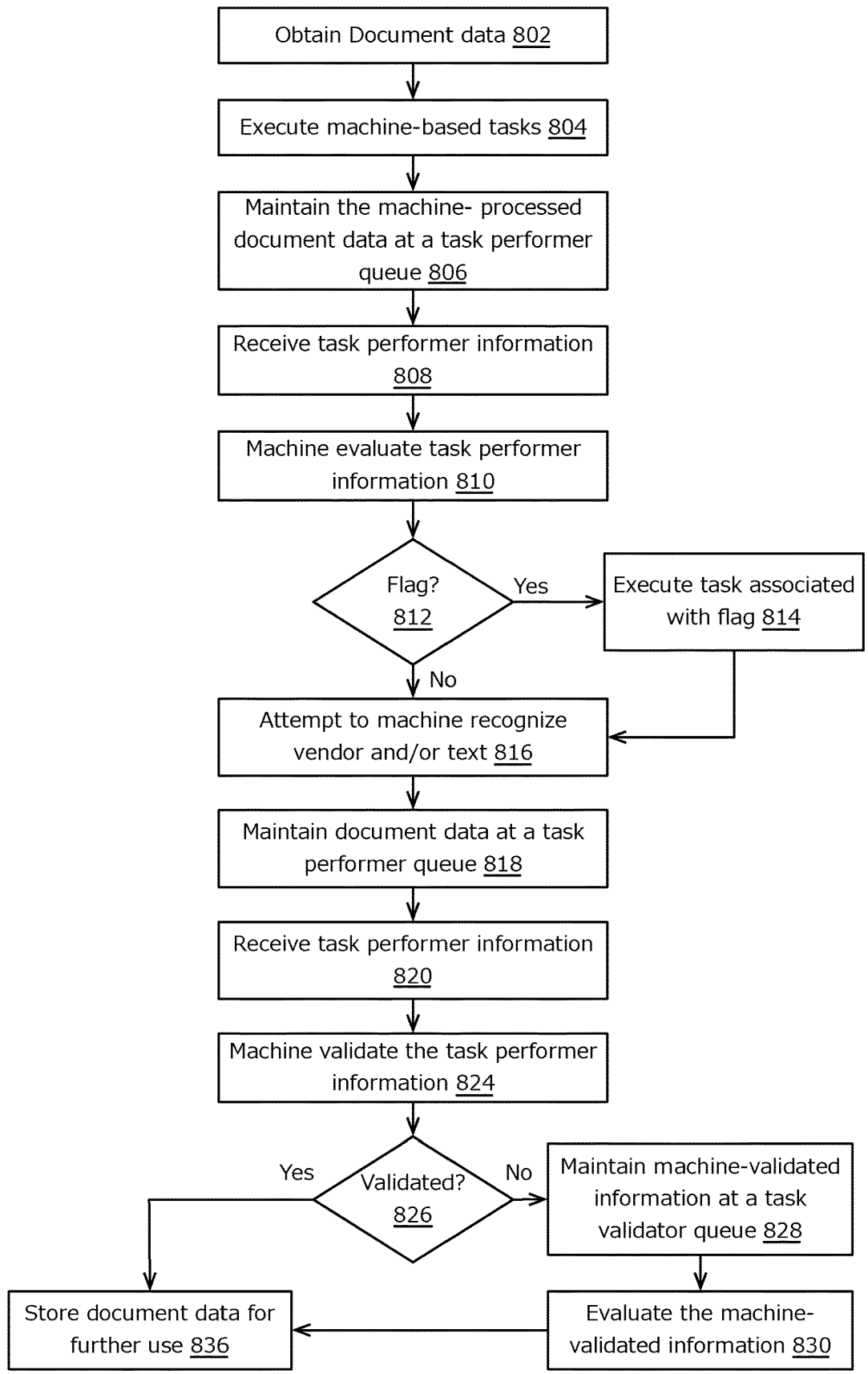
FIG. 8 illustrates an exemplary process for a collaborative text detection and text recognition service according to an embodiment.

FIG. 8 illustrates an exemplary process for a collaborative text detection and text recognition service according to an embodiment. In this example, document data is obtained 802. The document data may include images or other file formats that include representations of documents. The document data may represent invoices, personal documents, government documents, research papers, among other such documents described herein and known in the art. One or more machine-based tasks can be executed 804, including, for example, rotating documents, merging documents, filtering/flagging documents, etc., to generate machine-processed document data.

The machine-processed document data can be maintained 806 at a task performer queue associated with a task performer network (e.g., task performer network 243) for processing, such as to flag certain documents and/or document pages. Task performers as used herein may refer, by proxy, to humans associated with one or more task performer accounts operating a client device. In an example, a task performer associated with a task performer account may flag documents that include sensitive data, such as personally identifiable information (PII) or other information that could potentially be used to identify a particular person, including, for example, a full name, a social security number, driver's license number, bank account number, passport number, email address, etc. In another example, a task performer may flag documents that are not a particular document type. For example, in the situation where invoice documents are to be analyzed, a task performer may flag documents that are not invoices. In yet another example, a task performer may retrieve document field values from one or more document fields.

Task performer information can be received 808 from the task performer network. The task performer information can include tags identifying document pages to merge, documents to remove or redact, etc. The task performer information can be machine-evaluated 810. In an example, the task performer information can be analyzed for a flag, tag, or other information indicating a task is to be executed. In the situation a flag 812 is identified, the task associated with the flag can be executed 814. For example, the task performer information can be analyzed for a merge document tag or other information indicating documents to be merged. In this example, the merge document tag may indicate a task for one or more pages to be merged and/or sets of one or more pages to be merged. In another example, the task performer information can be analyzed for a PII tag, or other information indicating document pages contain PII. In this example, the PI tag may indicate a task for one or more page to be removed or redacted.

The document data can be analyzed 816 in an attempt to machine recognize vendor information and/or text. For example, in certain embodiments, a vendor associated with the document data is identified. In the situation a vendor is identified, document data in one or more document fields can be automatically retrieved. For example, a vendor may be associated with a vendor template. A vendor template can comprise a model of a document, where the model includes information identifying a location of one or more document fields, such as a date field, a document number field such as an invoice number field, an item quantity field, an item cost field, a total cost field, an item description field, etc. The document fields can be populated with document entry values, such as a number of items in the quantity field, the cost per item in the amount field, the total cost in the total amount field, text for the description field, etc. In this manner, when a vendor is recognized for a document, because the location of one or more document fields in the document is known, the data in those fields can be automatically retrieved upon recognizing the text in those data fields. In the situation a vendor is not identified, the document may be analyzed to recognize text, and/or a task may be generated to retrieve such information.

In any situation, the document data, and in certain embodiments, the document data and recognized text, can be maintained 818 at a task performer queue. The document data and/or recognized text can be associated with one or more tasks, and each task can include instructions for executing the task. An example task is a document summary task, which instructs the task performer to review and/or modify document data, including, for example, vendor name, invoice number, invoice amount, invoice date, etc. Other tasks may be included with the request, or submitted as a separate request, including, for example, a "detail task," a "review task," etc. In an embodiment, the modified document data can correspond to task performer information.

Task performer information can be received 820 from the task performer network in response to the task being executed. The task performer information can include information in response to one or more tasks. For example, the task performer information can include in response to the detail task, such as new or updated text corresponding to the item produce code, the item description, etc.

The task performer information can be machine-validated 824 to generate machine validated information. In an example, in the situation the task performer information includes an item quantity, an item rate, an item amount, a determination can be made whether the product of the item quantity and the item rate and compare the product of the item quantity and the item rate to the recognized item amount. In the situation the product of the item quantity and the item rate is not the same as the item amount, then the performer information and/or document information can be sent back to the task performer for further processing such as to execute the task.

Additionally or alternatively, the task performer information and/or document information can be maintained 828 at a task validator queue associated with a task validator network. A task validator can evaluate 830 the machine-validated information and make appropriate changes to the document information. In an example, the task validator can adjust one or more document entries associated with one of the item quantity, item rate, or item amount, and/or perform another task validation. In an embodiment, the updates can correspond to task validator information.

In the situation the task performer information is validated 826, or upon completion of the evaluation at the task validator network and approval by the task validator, the task performer information and/or the task validator information can be stored 836 as itemized data. Itemized data can include item level data, such as item product code, item description, item quantity, item rate, item amount, pack size, etc. The itemized data can be used in one or more other systems, including, for example, an accounting system, a purchasing system, an AI training system, and the like. In certain embodiments, specific item level data may be stored. For example, the document field values corresponding to item level data can be specified by a vendor configuration file. Advantageously, vendors may indicate itemized data to be obtained by specifying such data in the vendor configuration file. The vendor configuration file can be updated to select and/or deselect item level data to be obtained.

Figure 9:
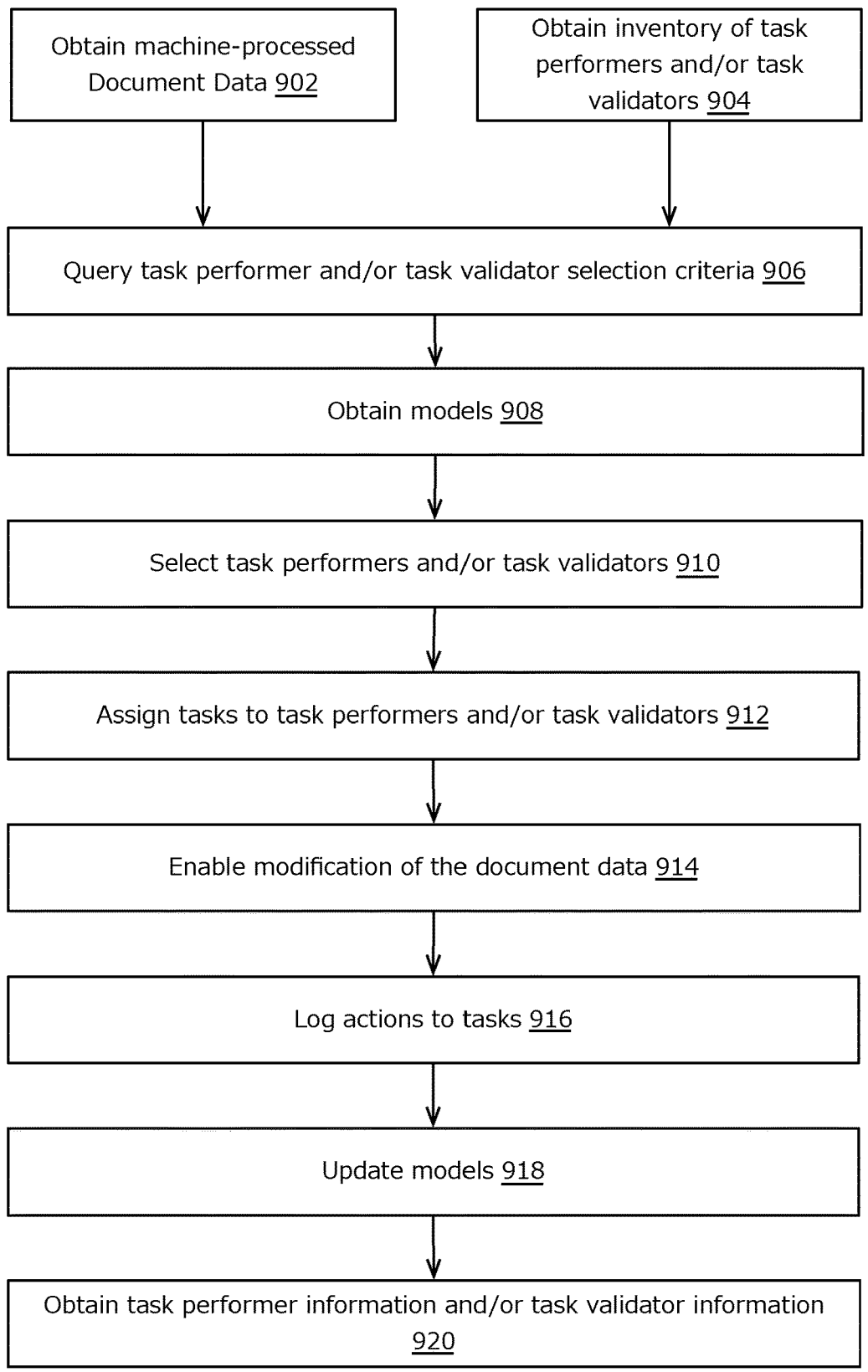
FIG. 9 illustrates an exemplary process for obtaining task performer and/or task validator information according to an embodiment.

FIG. 9 illustrates an exemplary process for obtaining task performer and/or task validator information according to an embodiment. In this example, document data is obtained 902 as described in step 802 of FIG. 8. An inventory of task performers and/or task validators can be obtained 904. The inventory of task performers can be obtained by obtaining an inventory or list of task performer accounts associated with one or more task performer networks. The inventory of task validators can be obtained by obtaining an inventory or list of task validator accounts associated with one or more task validator networks. In certain embodiments, the inventory of task performer accounts and/or task validator networks may be identified based on active task performer account logins in a task performer network and/or active task validator account logins in a task validator network.

Task performer and/or task validator selection criteria for the list of task performer accounts and the list of task validator accounts can be queried 906. In an embodiment, selection criteria can also be referred to as and specify performant dimensions, goals, requirements, preferences, metrics or other information indicating performance goals. The selection criteria can be received in the form of instructions such as a configuration file or other information indicating the selection criteria. The selection criteria may apply to a task performer and/or task validator. The selection criteria may specify, or include thresholds for task performer and/or task validator efficiency, task performer and/or task validator time thresholds, data processing load thresholds, throughput thresholds, etc. The selection criteria may specify an order of importance for individual selection criterion.

A plurality of models can be obtained 908. The plurality of models can be associated with task performers and/or task validators. In an example, a trained model can be used to generate features that can be used to predict a likelihood of successfully completing a task. In this example, the trained model can include a value for a feature representing the speed of a task performer and/or task validator. The feature can be compared to an appropriate threshold to determine whether the speed of the task performer and/or task validator is sufficient. In another example, a trained model can be used to generate features that can be used to predict an accuracy score for completing a task, such as extracting text. In this example, the trained model can include a value for a feature representing the accuracy of the task performer and/or task validator. The feature can be compared to an appropriate threshold to determine whether the accuracy level of the task performer and/or task validator is sufficient. The features in certain embodiments can be combined to generate a feature vector representing various features of the task performer and/or task validator. In yet another example, a trained model can be used to generate features that can be used to predict a likelihood of successfully resolving a task. In this example, the trained model can include a value for a feature representing the likelihood of successfully resolving a task. The feature can be compared to an appropriate threshold to determine whether the task performer and/or task validator will resolve the task. In another example, a trained model can be used to generate features that can be used to predict an amount of time to resolve a task. In yet another example, a trained model can be used to generate features to predict a likelihood of having to ask for assistance in resolving a task. In at least these examples, the trained models may represent values for features associated with the task performer and/or task validator and the features can be compared to an appropriate threshold to determine which task performer and/or task validator for selection. The features in certain embodiments can be combined to generate a feature vector representing various features of the task performer and/or task validator.

Based on the selection criteria and feature vectors (or models) for the task performers and/or task validators, a task performer and/or task validator can be selected 910 and the task assigned 912. For example, performant dimensions specified by the selection criteria can be compared to feature vectors of task performers and/or task validators stored in a database. In an embodiment, individual feature scores of the features can be an average score of the feature scores, a weighted average of the feature scores, a normalized average of the feature scores, etc. A selection score can be generated for each comparison based on a similarity of the feature vectors using an appropriate comparison technique known in the art. For example, at least one ranking technique can process the features or a feature vector to determine a set of selection scores or other such scores associated with selection criteria. A selection score can, for example, quantify the degree to which a task matches a particular task performer and/or task validator. The task performers and/or task validators can be ranked based on respective selection scores. For example, the task performers and/or task validators can be ranked from highest to lowest.

A list of accounts associated with the ranked task performers and/or task validators can be generated and an account can be selected based on the selection scores. Once a task is assigned to an appropriate task performer and/or task validator, modification of the document data is enabled 914. For example, the tasks to be presented in a graphical user interface that permits the task performer and/or task validator to quickly and efficiently triage and respond to the tasks. In an example, the tasks may be classified at a particular type of task, and each type of task can be associated with a user interface. For example, if the task is a document merge task, then information can be generated to present available document and document pages in such a way that the task may be completed.

An appropriate response can be provided to the task, including, for example, executing the task, etc. Actions taken to respond to the task can logged 916 to a log file, activity data store, or other appropriate location. The models and/or feature vectors may be updated 918 in accordance with embodiments described herein upon the completion of a task, upon completion of a number of tasks, in response to an event such as going offline or online of a task performer and/or task validator, with respect to an interval of time, or a combination thereof. Thereafter, task performer and/or task validator information can be obtained 920 and utilized in one or more other processes as described herein.

Figure 10:
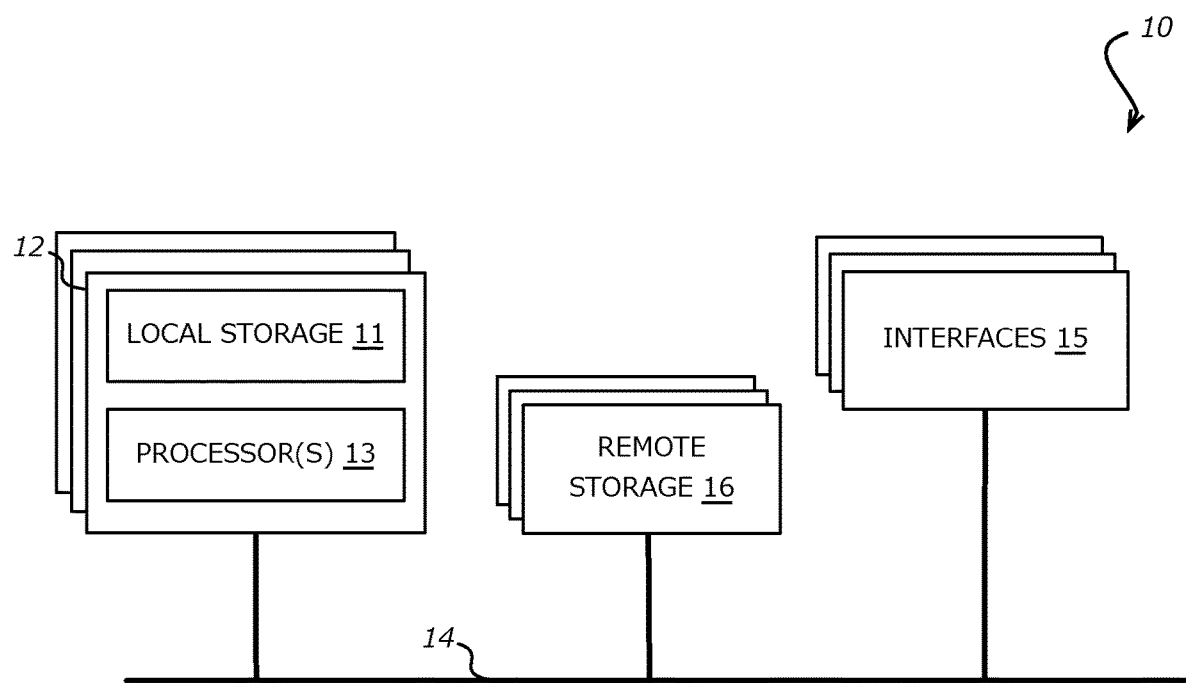
FIG. 10 illustrates components of a computing device that supports an embodiment of the present invention.

Referring now to FIG. 10, there is shown a block diagram depicting an exemplary computing device 10 suitable for implementing at least a portion of the features or functionalities disclosed herein. Computing device 10 may be, for example, any one of the computing machines listed in the previous paragraph, or indeed any other electronic device capable of executing software- or hardware-based instructions according to one or more programs stored in memory. Computing device 10 may be configured to communicate with a plurality of other computing devices, such as clients or servers, over communications networks such as a wide area network a metropolitan area network, a local area network, a wireless network, the Internet, or any other network, using known protocols for such communication, whether wireless or wired.

In one aspect, computing device 10 includes one or more central processing units (CPU) 12, one or more interfaces 15, and one or more busses 14 (such as a peripheral component interconnect (PCI) bus). When acting under the control of appropriate software or firmware, CPU 12 may be responsible for implementing specific functions associated with the functions of a specifically configured computing device or machine. For example, in at least one aspect, a computing device 10 may be configured or designed to function as a server system utilizing CPU 12, local memory 11 and/or remote memory 16, and interface(s) 15. In at least one aspect, CPU 12 may be caused to perform one or more of the different types of functions and/or operations under the control of software modules or components, which for example, may include an operating system and any appropriate applications software, drivers, and the like.

CPU 12 may include one or more processors 13 such as, for example, a processor from one of the Intel, ARM, Qualcomm, and AMD families of microprocessors. In some embodiments, processors 13 may include specially designed hardware such as application-specific integrated circuits (ASICs), electrically erasable programmable read-only memories (EEPROMs), field-programmable gate arrays (FPGAs), and so forth, for controlling operations of computing device 10. In a particular aspect, a local memory 11 (such as non-volatile random-access memory (RAM) and/or read-only memory (ROM), including for example one or more levels of cached memory) may also form part of CPU 12. However, there are many different ways in which memory may be coupled to system 10. Memory 11 may be used for a variety of purposes such as, for example, caching and/or storing data, programming instructions, and the like. It should be further appreciated that CPU 12 may be one of a variety of system-on-a-chip (SOC) type hardware that may include additional hardware such as memory or graphics processing chips, such as a QUALCOMM SNAPDRAGON™ or SAMSUNG EXYNOS™ CPU as are becoming increasingly common in the art, such as for use in mobile devices or integrated devices.

As used herein, the term "processor" is not limited merely to those integrated circuits referred to in the art as a processor, a mobile processor, or a microprocessor, but broadly refers to a microcontroller, a microcomputer, a programmable logic controller, an application-specific integrated circuit, and any other programmable circuit.

In one aspect, interfaces 15 are provided as network interface cards (NICs). Generally, NICs control the sending and receiving of data packets over a computer network; other types of interfaces 15 may for example support other peripherals used with computing device 10. Among the interfaces that may be provided are Ethernet interfaces, frame relay interfaces, cable interfaces, DSL interfaces, token ring interfaces, graphics interfaces, and the like. In addition, various types of interfaces may be provided such as, for example, universal serial bus (USB), Serial, Ethernet, FIREWIRE™, THUNDERBOLT™, PCI, parallel, radio frequency (RF), BLUETOOTH™, near-field communications (e.g., using near-field magnetics), 802.11 (WiFi), frame relay, TCP/IP, ISDN, fast Ethernet interfaces, Gigabit Ethernet interfaces, Serial ATA (SATA) or external SATA (ESATA) interfaces, high-definition multimedia interface (HDMI), digital visual interface (DVI), analog or digital audio interfaces, asynchronous transfer mode (ATM) interfaces, high-speed serial interface (HSSI) interfaces, Point of Sale (POS) interfaces, fiber data distributed interfaces (FDDIs), and the like. Generally, such interfaces 15 may include physical ports appropriate for communication with appropriate media. In some cases, they may also include an independent processor (such as a dedicated audio or video processor, as is common in the art for high-fidelity A/V hardware interfaces) and, in some instances, volatile and/or non-volatile memory (e.g., RAM).

Although the system shown in FIG. 10 illustrates one specific architecture for a computing device 10 for implementing one or more of the embodiments described herein, it is by no means the only device architecture on which at least a portion of the features and techniques described herein may be implemented. For example, architectures having one or any number of processors 13 may be used, and such processors 13 may be present in a single device or distributed among any number of devices. In one aspect, single processor 13 handles communications as well as routing computations, while in other embodiments a separate dedicated communications processor may be provided. In various embodiments, different types of features or functionalities may be implemented in a system according to the aspect that includes a client device (such as a tablet device or smartphone running client software) and server systems (such as a server system described in more detail below).

Regardless of network device configuration, the system of an aspect may employ one or more memories or memory modules (such as, for example, remote memory block 16 and local memory 11) configured to store data, program instructions for the general-purpose network operations, or other information relating to the functionality of the embodiments described herein (or any combinations of the above). Program instructions may control execution of or comprise an operating system and/or one or more applications, for example. Memory 16 or memories 11, 16 may also be configured to store data structures, configuration data, encryption data, historical system operations information, or any other specific or generic non-program information described herein.

Because such information and program instructions may be employed to implement one or more systems or methods described herein, at least some network device embodiments may include non-transitory machine-readable storage media, which, for example, may be configured or designed to store program instructions, state information, and the like for performing various operations described herein. Examples of such non-transitory machine-readable storage media include, but are not limited to, magnetic media such as hard disks, floppy disks, and magnetic tape; optical media such as CD-ROM disks; magneto-optical media such as optical disks, and hardware devices that are specially configured to store and perform program instructions, such as read-only memory devices (ROM), flash memory (as is common in mobile devices and integrated systems), solid state drives (SSD) and "hybrid SSD" storage drives that may combine physical components of solid state and hard disk drives in a single hardware device (as are becoming increasingly common in the art with regard to personal computers), memory storage, random access memory (RAM), and the like. It should be appreciated that such storage means may be integral and non-removable (such as RAM hardware modules that may be soldered onto a motherboard or otherwise integrated into an electronic device), or they may be removable such as swappable flash memory modules (such as "thumb drives" or other removable media designed for rapidly exchanging physical storage devices), "hot-swappable" hard disk drives or solid state drives, removable optical storage discs, or other such removable media, and that such integral and removable storage media may be utilized interchangeably. Examples of program instructions include both object code, such as may be produced by a compiler, machine code, such as may be produced by an assembler or a linker, byte code, such as may be generated by for example a JAVA™ compiler and may be executed using a Java virtual machine or equivalent, or files containing higher level code that may be executed by the computer using an interpreter (for example, scripts written in Python, Perl, Ruby, Groovy, or any other scripting language).

Figure 11:
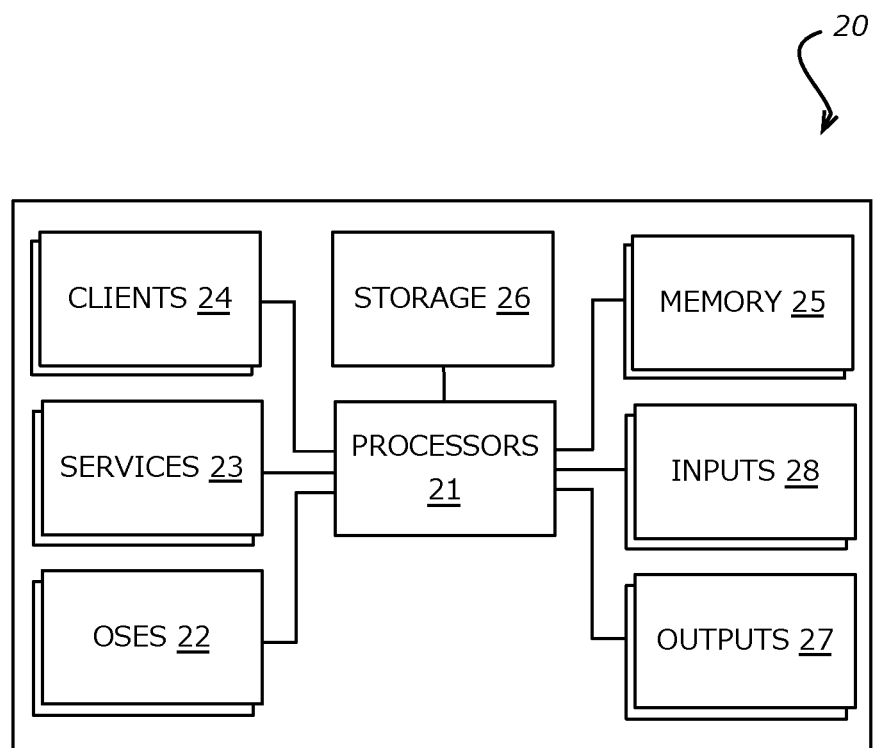
FIG. 11 illustrates an exemplary architecture of a system that supports an embodiment of the present invention.

In some embodiments, systems may be implemented on a standalone computing system. Referring now to FIG. 11, there is shown a block diagram depicting a typical exemplary architecture of one or more embodiments or components thereof on a standalone computing system. Computing device 20 includes processors 21 that may run software that carry out one or more functions or applications of embodiments, such as for example a client application 24. Processors 21 may carry out computing instructions under control of an operating system 22 such as, for example, a version of MICROSOFT WINDOWS™ operating system, APPLE macOS™ or iOS™ operating systems, some variety of the Linux operating system, ANDROID™ operating system, or the like. In many cases, one or more shared services 23 may be operable in system 20, and may be useful for providing common services to client applications 24. Services 23 may for example be WINDOWS™ services, user-space common services in a Linux environment, or any other type of common service architecture used with operating system 21. Input devices 28 may be of any type suitable for receiving user input, including for example a keyboard, touchscreen, microphone (for example, for voice input), mouse, touchpad, trackball, or any combination thereof. Output devices 27 may be of any type suitable for providing output to one or more users, whether remote or local to system 20, and may include for example one or more screens for visual output, speakers, printers, or any combination thereof. Memory 25 may be random-access memory having any structure and architecture known in the art, for use by processors 21, for example to run software. Storage devices 26 may be any magnetic, optical, mechanical, memory storage, or electrical storage device for storage of data in digital form (such as those described above, referring to FIG. 10). Examples of storage devices 26 include flash memory, magnetic hard drive, CD-ROM, and/or the like.

Figure 12:
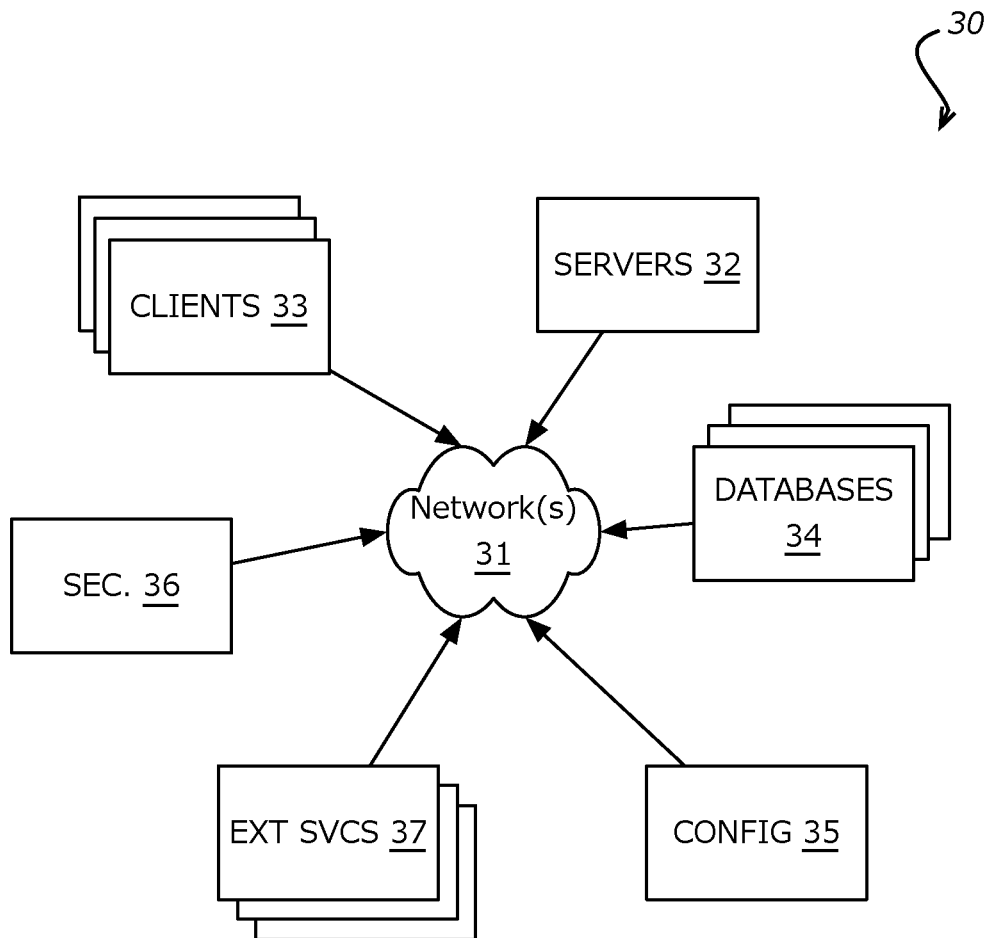
FIG. 12 illustrates another exemplary architecture of a system that supports an embodiment of the present invention.

In some embodiments, systems may be implemented on a distributed computing network, such as one having any number of clients and/or servers. Referring now to FIG. 12, there is shown a block diagram depicting an exemplary architecture 30 for implementing at least a portion of a system according to one aspect on a distributed computing network. According to the aspect, any number of clients 33 may be provided. Each client 33 may run software for implementing client-side portions of a system; clients may comprise a system 20 such as that illustrated in FIG. 11. In addition, any number of servers 32 may be provided for handling requests received from one or more clients 33. Clients 33 and servers 32 may communicate with one another via one or more electronic networks 31, which may be in various embodiments any of the Internet, a wide area network, a mobile telephony network (such as CDMA or GSM cellular networks), a wireless network (such as WiFi, WiMAX, LTE, and so forth), or a local area network (or indeed any network topology known in the art; the aspect does not prefer any one network topology over any other). Networks 31 may be implemented using any known network protocols, including for example wired and/or wireless protocols.

In addition, in some embodiments, servers 32 may call external services 37 when needed to obtain additional information, or to refer to additional data concerning a particular call. Communications with external services 37 may take place, for example, via one or more networks 31. In various embodiments, external services 37 may comprise web-enabled services or functionality related to or installed on the hardware device itself. For example, in one aspect where client applications 24 are implemented on a smartphone or other electronic device, client applications 24 may obtain information stored in a server system 32 in the cloud or on an external service 37 deployed on one or more of a particular enterprise's or user's premises.

In some embodiments, clients 33 or servers 32 (or both) may make use of one or more specialized services or appliances that may be deployed locally or remotely across one or more networks 31. For example, one or more databases 34 may be used or referred to by one or more embodiments. It should be understood by one having ordinary skill in the art that databases 34 may be arranged in a wide variety of architectures and using a wide variety of data access and manipulation means. For example, in various embodiments one or more databases 34 may comprise a relational database system using a structured query language (SQL), while others may comprise an alternative data storage technology such as those referred to in the art as "NoSQL" (for example, HADOOP CASSANDRA™, GOOGLE BIGTABLE™, and so forth). In some embodiments, variant database architectures such as column-oriented databases, in-memory databases, clustered databases, distributed databases, or even flat file data repositories may be used according to the aspect. It will be appreciated by one having ordinary skill in the art that any combination of known or future database technologies may be used as appropriate, unless a specific database technology or a specific arrangement of components is specified for a particular aspect described herein. Moreover, it should be appreciated that the term "database" as used herein may refer to a physical database machine, a cluster of machines acting as a single database system, or a logical database within an overall database management system. Unless a specific meaning is specified for a given use of the term "database", it should be construed to mean any of these senses of the word, all of which are understood as a plain meaning of the term "database" by those having ordinary skill in the art.

Similarly, some embodiments may make use of one or more security systems 36 and configuration systems 35. Security and configuration management are common information technology (IT) and web functions, and some amount of each are generally associated with any IT or web systems. It should be understood by one having ordinary skill in the art that any configuration or security subsystems known in the art now or in the future may be used in conjunction with embodiments without limitation, unless a specific security 36 or configuration system 35 or approach is specifically required by the description of any specific aspect.

Figure 13:
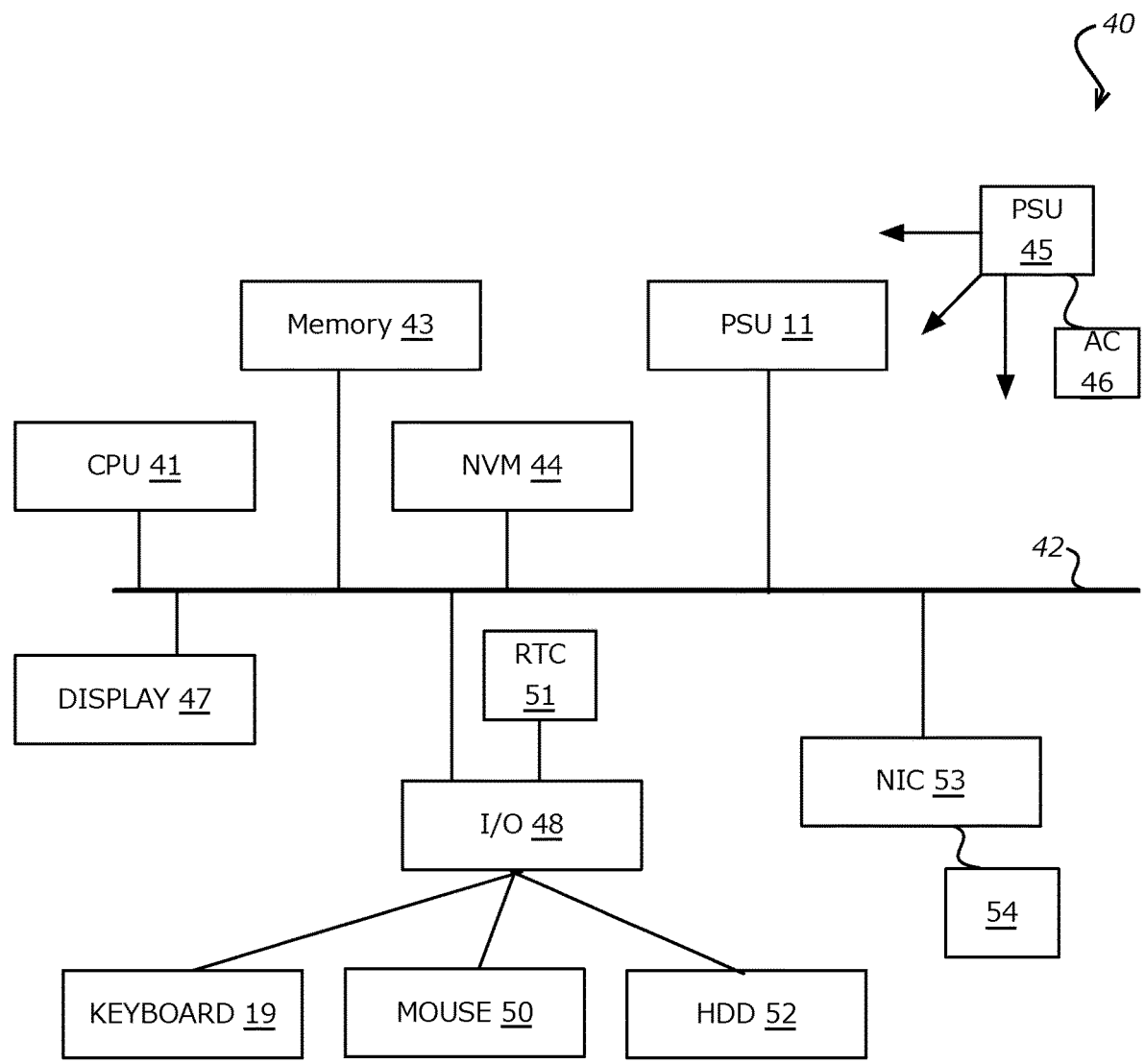
FIG. 13 illustrates components of a computer system that supports an embodiment of the present invention.

FIG. 13 shows an exemplary overview of a computer system 40 as may be used in any of the various locations throughout the system. It is exemplary of any computer that may execute code to process data. Various modifications and changes may be made to computer system 40 without departing from the broader scope of the system and method disclosed herein. Central processor unit (CPU) 41 is connected to bus 42, to which bus is also connected memory 43, nonvolatile memory 44, display 47, input/output (I/O) unit 48, and network interface card (NIC) 53. I/O unit 48 may, typically, be connected to keyboard 49, pointing device 50, hard disk 52, and real-time clock 51. NIC 53 connects to network 54, which may be the Internet or a local network, which local network may or may not have connections to the Internet. Also shown as part of system 40 is power supply unit 45 connected, in this example, to a main alternating current (AC) supply 46. Not shown are batteries that could be present, and many other devices and modifications that are well known but are not applicable to the specific novel functions of the current system and method disclosed herein. It should be appreciated that some or all components illustrated may be combined, such as in various integrated applications, for example Qualcomm or Samsung system-on-a-chip (SOC) devices, or whenever it may be appropriate to combine multiple capabilities or functions into a single hardware device (for instance, in mobile devices such as smartphones, video game consoles, in-vehicle computer systems such as navigation or multimedia systems in automobiles, or other integrated hardware devices).

In various embodiments, functionality for implementing systems or methods of various embodiments may be distributed among any number of client and/or server components. For example, various software modules may be implemented for performing various functions in connection with the system of any particular aspect, and such modules may be variously implemented to run on server and/or client components.

The skilled person will be aware of a range of possible modifications of the various embodiments described above. Accordingly, the present invention is defined by the claims and their equivalents.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for collaborative text detection and recognition through the disclosed principles herein. Thus, while particular embodiments and applications have been illustrated and described, it is to be understood that the disclosed embodiments are not limited to the precise construction and components disclosed herein. Various apparent modifications, changes and variations may be made in the arrangement, operation and details of the method and apparatus disclosed herein without departing from the spirit and scope defined in the appended claims.

Accordingly, one or more different embodiments may be described in the present application. Further, for one or more of the embodiments described herein, numerous alternative arrangements may be described; it should be appreciated that these are presented for illustrative purposes only and are not limiting of the embodiments contained herein or the claims presented herein in any way. One or more of the arrangements may be widely applicable to numerous embodiments, as may be readily apparent from the disclosure. In general, arrangements are described in sufficient detail to enable those skilled in the art to practice one or more of the embodiments, and it should be appreciated that other arrangements may be utilized and that structural, logical, software, electrical and other changes may be made without departing from the scope of the embodiments. Particular features of one or more of the embodiments described herein may be described with reference to one or more particular embodiments or figures that form a part of the present disclosure, and in which are shown, by way of illustration, specific arrangements of one or more of the aspects. It should be appreciated, however, that such features are not limited to usage in the one or more particular embodiments or figures with reference to which they are described. The present disclosure is neither a literal description of all arrangements of one or more of the embodiments nor a listing of features of one or more of the embodiments that must be present in all arrangements.

Headings of sections provided in this patent application and the title of this patent application are for convenience only and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible embodiments and in order to more fully illustrate one or more embodiments. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the embodiments, and does not imply that the illustrated process is preferred. Also, steps are generally described once per aspect, but this does not mean they must occur once, or that they may only occur once each time a process, method, or algorithm is carried out or executed. Some steps may be omitted in some embodiments or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other embodiments need not include the device itself.

Techniques and mechanisms described or referenced herein will sometimes be described in singular form for clarity. However, it should be appreciated that particular embodiments may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various embodiments in which, for example, functions may be executed out of order from that shown or discussed, including substantially concurrently or in reverse order, depending on the functionality involved, as would be understood by those having ordinary skill in the art.

What is claimed is:

1. A computing system, comprising:
   at least one computing processor; and
   memory including instructions that, when executed by the at least one computing processor, enable the computing system to:
   obtain training data comprising representations of a plurality of invoices associated with a vendor template, the vendor template including a plurality of document fields for a type of invoice;
   train a vendor detection model on the plurality of invoices to generate a trained vendor detection model, the trained vendor detection model operable to generate a vendor identification score quantifying a degree of similarity for candidate vendor templates, the trained vendor detection model constructed according to a machine learning model;
   obtain image data that includes a representation of a plurality of documents;
   orientate individual documents of the plurality of documents with respect to a reference point to generate machine-orientated documents;
   maintain the machine-orientated documents at a task performer queue associated with a task performer network;
   receive first task performer information from the task performer network, the first task performer information including, at least a portion of the machine-orientated documents being associated with a merge document tag;

merge documents associated with the merge document tag to generate a merged document, the merged document comprising an invoice;

evaluate the trained vendor detection model on the invoice to match the invoice to a stored invoice associated with vendor information;

retrieve the vendor information, wherein the vendor information is associated with a configuration file specifying a set of document fields associated with a plurality of regions of text;

recognize text of the plurality of regions of text using a machine-based optical character recognition engine to generate recognized text associated with the plurality of regions of text;

segment the recognized text into a plurality of subgroups of recognized text based on the configuration file and the plurality of regions of text;

maintain the plurality of subgroups of recognized text at the task performer queue;

cause an overlay of at least one subgroup of the plurality of subgroups of recognized text to be presented as user-selectable elements to a human task performer associated with the task performer network, the overlay being presented with a vendor template associated with the invoice;

enable modification of the at least one subgroup of recognized text by the human task performer;

receive second human reviewer information corresponding to a modified version of the at least one subgroup of recognized text;

validate the modified Version of the at least one subgroup of recognized text to determine machine-validated invoice entries;

maintain the machine-validated invoice entries at a human task validator queue associated with a task validation network;

receive human task validator information approving the machine-validated invoice entries; and generate at least one of itemized data or vendor template training data from validated machine-validated invoice entries.

2. The computing system of claim 1, wherein the instructions when executed by the at least one computing processor further enable the computing system to:

scan the plurality of documents for a flag, the flag identifying one of personally identifiable information or an unauthorized document type; and maintain documents associated with the flag at the human task validator queue for further processing.

3. The computing system of claim 1, wherein the instructions when executed by the at least one computing processor further enable the computing system to:

execute a document merge function on documents flagged as being related to generate merged documents.

4. The computing system of claim 1, wherein the instructions when executed by the at least one computing processor further enable the computing system to:

detect a plurality of document fields; and analyze the plurality of document fields to locate a plurality of regions of text represented in the plurality of document fields.

5. The computing system of claim 4, wherein the instructions when executed by the at least one computing processor further enable the computing system to:

apply a bounding box around each document field.

6. The computing system of claim 1, wherein the instructions when executed by the at least one computing processor further enable the computing system to:

assign at least one subgroup of recognized text of the plurality of subgroups of recognized text to a human task performer of a plurality of human task performers based on performance information associated with the plurality of human task performers.

7. The computing system of claim 1, wherein modification includes an addition of text to the recognized text, a removal of recognized text, or a change to the recognized text.

8. The computing system of claim 1, wherein a document field includes one of quantity field, a description field, a rate field, product code field, unit of measure field, or an amount field.

9. The computing system of claim 1, wherein the instructions when executed by the at least one computing processor further enable the computing system to:

receive modification of the text by at the human task performer to generate modified text; and generate a consensus string of text comprising at least a portion of the text recognized using the machine-based optical character recognition engine and the modified text.

10. The computing system of claim 1, wherein the instructions when executed by the at least one computing processor further enable the computing system to:

iteratively train the vendor detection model using the training data.

11. The computing system of claim 1, wherein the instructions when executed by the at least one computing processor further enable the computing system to:

enable a text edit input region for the text of the plurality of regions of text.

12. The computing system of claim 1, wherein the instructions when executed by the at least one computing processor further enable the computing system to:

provide instructions on how to review the at least one subgroup of recognized text to the human task performer.

13. The computing system of claim 1, wherein the instructions when executed by the at least one computing processor further enable the computing system to:

compare recognized text with the modified version of the at least one subgroup of recognized text received from the human task performer; and determine an accuracy of the human task performer.

14. The computing system of claim 1, wherein the image data includes a representation of a financial statement.

15. A computer-implemented method, comprising:

obtaining training data comprising representations of a plurality of invoices associated with a vendor template, the vendor template including a plurality of document fields for a type of invoice;

training a vendor detection model on the plurality of invoices to generate a trained vendor detection model, the trained vendor detection model operable to generate a vendor identification score quantifying a degree of similarity for candidate vendor templates, the trained vendor detection model constructed according to a machine learning model;

obtaining image data that includes a representation of a plurality of documents;

orientating individual documents of the plurality of documents with respect to a reference point to generate machine-orientated documents;

maintaining the machine-orientated documents at a task performer queue associated with a task performer network;

receiving first task performer information from the task performer network, the first task performer information including at least a portion of the machine-orientated documents being associated with a merge document tag;

merging documents associated with the merge document tag to generate a merged document, the merged document comprising an invoice;

evaluating the trained vendor detection model on the invoice to match the invoice to a stored invoice associated with vendor information;

retrieving the vendor information, wherein the vendor information is associated with a configuration file specifying a set of document fields associated with a plurality of regions of text;

recognizing text of the plurality of regions of text using a machine-based optical character recognition engine to generate recognized text associated with the plurality of regions of text;

segmenting the recognized text into a plurality of subgroups of recognized text based on the configuration file and the plurality of regions of text;

maintaining the plurality of subgroups of recognized text at the task performer queue;

causing an overlay a at least one subgroup of the plurality of subgroups of recognized text to be presented as user-selectable elements to a human task performer associated with the task performer network, the overlay being presented with a vendor template associated with the invoice;

enabling modification of the at least one subgroup of recognized text by the human task performer;

receiving second human reviewer information corresponding to a modified version of the at least one subgroup of recognized text;

validating the modified version of the at least one subgroup of recognized text to determine machine-validated invoice entries;

maintaining the machine-validated invoice entries at a human task validator queue associated with a task validation network;

receiving human task validator information approving the machine-validated invoice entries; and generating at least one of itemized data or vendor template training data from validated machine-validated invoice entries.

16. The computer-implemented method of claim 15, further comprising:

scanning the plurality of documents for a flag, the flag identifying one of personally identifiable information or an unauthorized document type; and maintaining documents associated with the flag at the human task validator queue for further processing.

17. The computer-implemented method of claim 15, further comprising:

detecting a plurality of document fields; and analyzing the plurality of document fields to locate a plurality of regions of text represented in the plurality of document fields.

18. The computer-implemented method of claim 15, further comprising:

receiving modification of the text by at the human task performer to generate modified text; and generating a consensus string of text comprising at least a portion of the text recognized using the machine-based optical character recognition engine and the modified text.

19. The computer-implemented method of claim 15, further comprising:

iteratively train the vendor detection model using the training data.

20. A non-transitory computer readable storage medium storing instructions that, when executed by at least one processor of a computing system, causes the computing system to:

obtain training data comprising representations of a plurality of invoices associated with a vendor template, the vendor template including a plurality of document fields for a type of invoice;

train a vendor detection model on the plurality of invoices to generate a trained vendor detection model, the trained vendor detection model operable to generate a vendor identification score quantifying a degree of similarity for candidate vendor templates, the trained vendor detection model constructed according to a machine learning model;

obtain image data that includes a representation of a plurality of documents;

orientate individual documents of the plurality of documents with respect to a reference point to generate machine-orientated documents;

maintain the machine-orientated documents at a task performer queue associated with a task performer network;

receive first task performer information from the task performer network, the first task performer information including at least a portion of the machine-orientated documents being associated with a merge document, tag;

merge documents associated with the merge document tag to generate a merged document, the merged document comprising an invoice;

evaluate the trained vendor detection model on the invoice to match the invoice to a stored invoice associated with vendor information;

retrieve the vendor information, wherein the vendor information is associated with a configuration file specifying a set of document fields associated with a plurality of regions of text;

recognize text of the plurality of regions of text using a machine-based optical character recognition engine to generate recognized text associated with the plurality of regions of text;

segment, the recognized text into a plurality of subgroups of recognized text based on the configuration file and the plurality of regions of text;

maintain the plurality of subgroups of recognized text at the task performer queue;

cause an overlay of at least one subgroup of the plurality of subgroups of recognized text to be presented as user-selectable elements to a human task performer associated with the task performer network, the overlay being presented with a vendor template associated with the invoice;

enable modification of the at least one subgroup of recognized text by the human task performer;

receive second human reviewer information corresponding to a modified version of the at least one subgroup of recognized text;

validate the modified version of the at least one subgroup of recognized text to determine machine-validated invoice entries;

maintain the machine-validated invoice entries at a human task validator queue associated with a task validation network;

receive human task validator information approving the machine-validated invoice entries; and generate at least one of itemized data or vendor template training data from validated machine-validated invoice entries.

\* \* \* \* \*